(12) United States Patent
Bito et al.

(10) Patent No.: US 6,624,440 B2
(45) Date of Patent: Sep. 23, 2003

(54) FIELD EFFECT TRANSISTOR

(75) Inventors: Yasunori Bito, Tokyo (JP); Naotaka Iwata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/021,540

(22) Filed: Oct. 30, 2001

(65) Prior Publication Data

US 2002/0053682 A1 May 9, 2002

Related U.S. Application Data

(62) Division of application No. 09/263,838, filed on Mar. 8, 1999.

(30) Foreign Application Priority Data

Mar. 6, 1998 (JP) .............................................. 10-54569

(51) Int. Cl.⁷ .............................................. H01L 29/06
(52) U.S. Cl. ........................... 257/20; 257/15; 257/22; 257/24; 257/27; 257/192; 257/194; 257/201; 257/745
(58) Field of Search ................................ 257/192, 194, 257/196, 200, 201

(56) References Cited

U.S. PATENT DOCUMENTS

| | | | |
|---|---|---|---|
| 5,367,183 A | * 11/1994 | Perea et al. | .............. 257/194 |
| 5,416,337 A | 5/1995 | Change et al. | |
| 5,504,353 A | 4/1996 | Kuzuhara | |
| 5,739,558 A | 4/1998 | Ishida et al. | |

FOREIGN PATENT DOCUMENTS

| | | |
|---|---|---|
| EP | 0 143 656 | 6/1985 |
| EP | 0 841 691 | 5/1998 |
| JP | 63-221683 | 9/1988 |
| JP | 4-103136 | 4/1992 |
| JP | 4-186849 | 7/1992 |
| JP | 7-66385 | 3/1995 |
| JP | 7-111327 | 4/1995 |
| JP | 7-335867 | 12/1995 |

OTHER PUBLICATIONS

Abe, M., et al., "Ultra–High–Speed HEMT LSI Technology," Fujitsu Scientific & Technical Journal, vol. 24, No. 4, pp. 271–283 (1988).

Patent Abstracts of Japan, [JP 04 103136], vol. 016, No. 340 (E–1238), Jul. 23, 1992.

Yoshida et al., "High Efficiency Power Module Using HEMT for PDC", presented at the 1996 Conventional of the Electronics and Information Engineers of Japan, vol. 2, p. 30, (Aug. 1996).

* cited by examiner

*Primary Examiner*—Long Pham
*Assistant Examiner*—Wai-Sing Louie
(74) *Attorney, Agent, or Firm*—Foley & Lardner

(57) ABSTRACT

An FET (Field Effect Transistor) has an epitaxial wafer including an $Al_{0.2}Ga_{0.8}As$ gate contact layer. A GaAs gate buried layer doped with Si, $Al_{0.2}Ga_{0.8}As$ wide-recess stopper layer doped with Si, an undoped GaAs layer and a GaAs cap layer doped with Si are sequentially formed on the gate contact layer by epitaxial growth. An electron accumulation layer is formed on the undoped GaAs layer and reduces a potential barrier. This allows electrons to pass through the potential barrier of the AlGaAs layer with higher probability. Because the GaAs layer is not doped with an impurity, electrons are scattered little and achieve higher mobility. It is therefore possible to reduce contact resistance from the cap layer to a channel layer. In addition, sheet resistance sparingly increases because the gate contact layer is not exposed to the outside. An ON resistance as low as 1.4 $\Omega \cdot mm$ is achievable which is lower than the conventional ON resistance by 0.2 $\Omega \cdot mm$.

11 Claims, 34 Drawing Sheets

FIELD EFFECT TRANSISTOR

This is a Divisional Application of application Ser. No. 09/263,838, filed Mar. 8, 1999.

BACKGROUND OF THE INVENTION

The present invention relates to an FET (Field Effect Transistor) and more particularly to a hetero junction FET.

GaAs FETs are extensively used as high frequency devices. As for a high power device, among others, a multi-step recess structure is used to reduce a source resistance and to guarantee a gate breakdown voltage, as taught in, e.g., a paper entitled "High Efficiency Power Module Using HEMT for PDC" presented at the 1996 Conventional of the Electronics Society, the Institute of Electronics and Information Engineers of Japan, Vol. 2, p. 30 (issued Aug. 30, 1996).

On the other hand, ON resistance of an FET, having a multi-step recess structure, is the total distributed equivalent resistance from a source electrode to a drain electrode. A low ON resistance is essential for implementing a desirable power and a desirable efficiency characteristic at low voltage operation. However, an ON resistance available with conventional FETs is high because a contact resistance from a cap layer to a channel layer is high. In addition, sheet resistances at an exposed GaAs layer portion and an exposed AlGaAs gate contact layer portion are high, further increasing the ON resistance.

Technologies relating to the present invention are disclosed in, e.g., Japanese Patent Laid-Open Publication Nos. 4-103136 and 7-335867 and Japanese Patent Application No. 8-288610.

SUMMARY OF THE INVENTION

It is therefore an object of the present invention to provide a hetero junction FET having low contact resistance from a cap layer to a channel layer and low resistance at a portion where a GaAs gate buried layer is exposed to the outside.

In accordance with the present invention, in an FET using a semiconductor crystal including at least either an undoped InGaAs channel layer or an undoped GaAs channel layer and a first AlGaAs gate contact layer, a second GaAs gate buried layer, a third AlGaAs layer and a fourth GaAs cap layer sequentially formed on the undoped InGaAs channel layer or the undoped GaAs channel layer, and having a double recess structure formed by using the first and third AlGaAs layers as etching stopper layers, a third AlGaAs layer is doped with a high concentration n-type impurity. A fourth GaAs layer includes an undoped layer contacting the third AlGaAs layer and a layer doped with a high concentration n-type impurity and forming the top of the fourth GaAs layer. The second GaAs gate buried layer and a gate electrode contact each other without any gap.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 33:
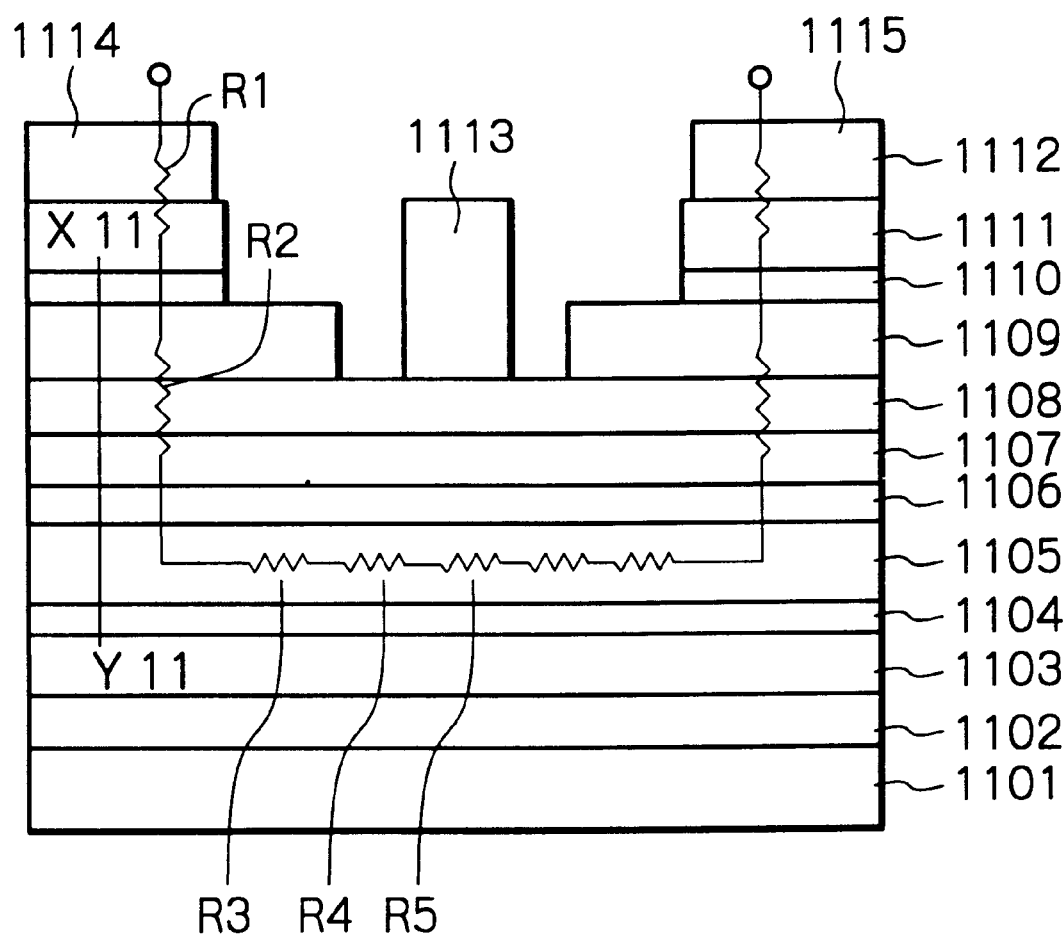
FIG. 33 is a section showing a specific conventional FET.

To better understand the present invention, brief reference will be made to a conventional FET, shown in FIG. 33. A multi-recess structure is formed by using, e.g., a GaAs/AlGaAs laminate structure and selective etching. As shown in FIG. 33, the FET includes a semi-insulating GaAs substrate 1101. There are formed on the substrate 1101 an undoped $Al_{0.2}Ga_{0.8}As$ buffer layer 1102, an $Al_{0.2}Ga_{0.8}As$ electron supply layer 1103 doped with Si, an undoped $Al_{0.2}Ga_{0.8}As$ spacer layer 1104, an undoped $In_{0.2}Ga_{0.8}As$ channel layer 1105, an undoped $Al_{0.2}Ga_{0.8}As$ spacer layer 1106, an $Al_{0.2}Ga_{0.8}As$ electron supply layer 1107 doped with Si, an undoped $Al_{0.2}Ga_{0.8}As$ gate contact layer 1108, a GaAs gate buried layer 1109, an $Al_{0.2}Ga_{0.8}As$ wide-recess stopper layer 1110 doped with Si, and a GaAs cap layer 1111 doped with Si. To form this recess structure, after a mask formed with a wide recess pattern has been formed, the GaAs layer 1111 is selectively etched with the wide-recess stopper layer 1110 serving as a stopper layer. Then, after the removal of the mask, a new mask formed with a gate recess pattern is formed. Subsequently, the GaAs layer 1109 is selectively etched with the gate contact layer 1108 playing the role of a stopper layer. In the specific structure shown in FIG. 33, the sides of a gate electrode are spaced from the GaAs layer by relatively great gaps.

FIG. 33 also shows distributed equivalent resistances in the conventional FET. The resistances include a contact resistance R1 from the ohmic electrode to the cap layer, a contact resistance R2 from the cap layer to the channel layer, a sheet resistance R3 at a portion where the gate buried GaAs layer is exposed, a sheet resistance R4 at a portion where the AlGaAs gate contact layer is exposed, and a sheet resistance R5 beneath the gate electrode. The ON resistance of the FET should be low for the reason stated earlier.

Figure 34:
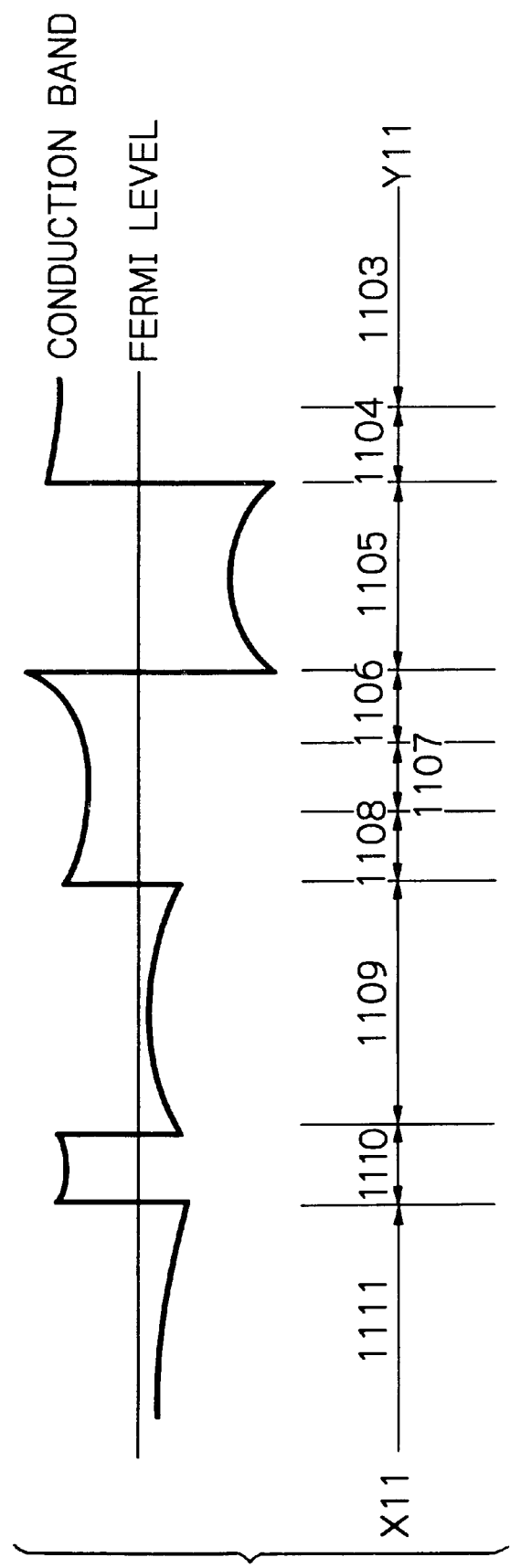
FIG. 34 shows a potential energy between a cap layer and a channel layer included in the FET of FIG. 33.

However, the above conventional FET has some problems left unsolved, as follows. To begin with, the contact resistance R2 from the cap layer to the channel layer is high and therefore the ON resistance is high. FIG. 34 shows a conduction band profile in a direction X11–Y11 shown in FIG. 33. As FIG. 34 indicates, the high contact resistance is ascribable to the fact that the AlGaAs stopper layer used to form the multi-step recess structure has a high potential barrier, limiting the tunnel probability from the cap layer to the channel layer.

Another problem is that when the Al GaAs stopper layer is removed after the formation of the wide recess, the distance between the exposed GaAs surface and the channel beneath it is reduced, increasing the sheet resistance R3 and therefore the ON resistance is high. This is because a depletion layer extends from the exposed GaAs layer surface toward the channel layer and causes electrons in the channel to be depleted.

A further problem is that because the sides of the gate electrode do not contact the GaAs layer, the AlGaAs gate contact layer is exposed to the outside at the sides of the gate electrode. As a result, electrons in the channel layer are also depleted by a surface depletion layer extending from the AlGaAs gate contact layer.

Preferred embodiments of the FET in accordance with the present invention and capable of solving the above problems will be described hereinafter.

1st Embodiment

Figure 1:
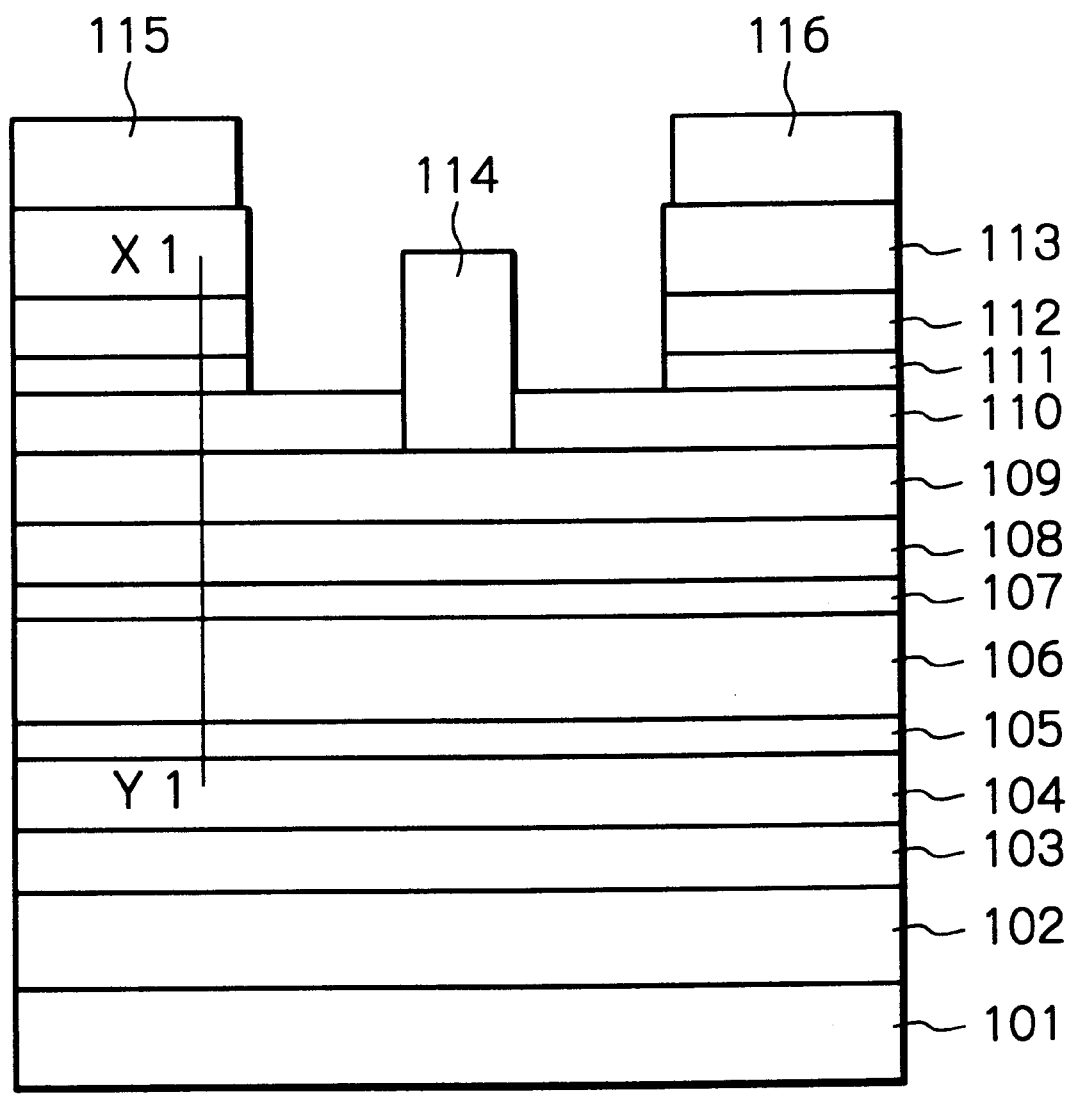
FIG. 1 is a section showing a first embodiment of the FET in accordance with present invention.

Referring to FIG. 1 of the drawings, an FET embodying the present invention is shown and includes a semi-insulating GaAs substrate 101. As shown, there are sequentially formed on the substrate 101 a 400 nm thick undoped GaAs buffer layer 102, a 100 nm thick undoped $Al_{0.2}Ga_{0.8}As$ buffer layer 103, a 4 nm thick $Al_{0.2}Ga_{0.8}As$ electron supply layer 104 doped with $4\times10^{18}$ $cm^{-3}$ of Si, a 2 nm thick undoped $Al_{0.2}Ga_{0.8}As$ spacer layer 105, a 15 nm thick undoped $In_{0.2}Ga_{0.8}As$ channel layer 106, a 2 nm thick undoped $Al_{0.2}Ga_{0.8}As$ spacer layer 107, a 9 nm thick $Al_{0.2}Ga_{0.8}As$ electron supply layer 108 doped with $4\times10^{18}$ $cm^{-3}$ of Si, a 10 nm thick undoped $Al_{0.2}Ga_{0.8}As$ gate contact layer 109, a 30 nm thick GaAs gate buried layer 110 doped with $5\times10^{16}$ $cm^{-3}$ of Si, a 6 nm thick $Al_{0.2}Ga_{0.8}As$ wide-recess stopper layer 111 doped with $4\times10^{18}$ $cm^{-3}$ of Si, a 6 nm thick undoped GaAs layer 112 and a 100 nm thick GaAs cap layer 113 doped with $4\times10^{18}$ $cm^{-3}$ of Si by epitaxial growth. To produce such an epitaxial wafer, use may be made of a molecular beam epitaxial growth (MBE) scheme or a metal organic vapor phase epitaxial growth (MOVPE) scheme.

After the above epitaxial wafer has been produced, a mask formed with a recess pattern is formed on the wafer. Then, the GaAs layers 113 and 112 are selectively etched with the wide-recess stopper layer 111 serving as a stop layer. To so etch the two layers 113 and 112, there may be used dry etching using an ECR (Electron Cyclotron Resonance) etching system or an RIE (Reactive Ion Etching) system and a mixture of chloride gas containing only chlorine as a halogen element and fluoride gas containing only fluorine, e.g., a $BCl_3$ and $SF_6$ mixture.

After the removal of the above mask, the GaAs gate buried layer 110 is selectively etched via a newmask formed with agate recess pattern with the gate contact layer 109 serving as a stopper layer. As a result, the undoped gate contact layer 109 is exposed to the outside. At this instant, the buried layer 110 is not overetched. A gate electrode 114 is formed on the exposed gate contact layer 109. This produces a structure in which no gaps are present at the sides of the gate electrode 114.

Subsequently, a source electrode 115 and a drain electrode 116 are formed by the evaporation lift-off and alloying (e.g. 400° C./1 min) of AuGe, serving as ohmic electrodes.

Figure 2:
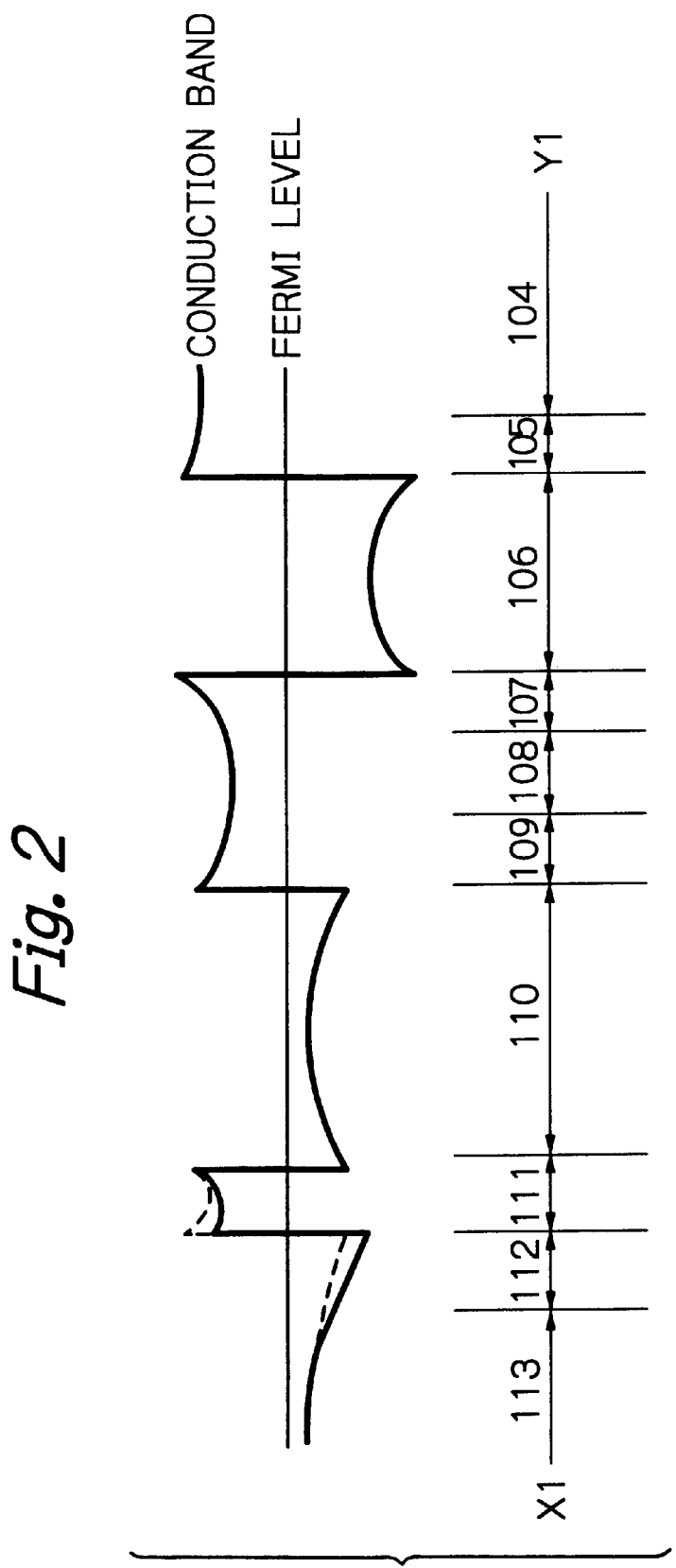
FIG. 2 shows a conduction band profile between a cap layer and a channel layer included in the first embodiment.

FIG. 2 shows a conduction band profile in a direction X1–Y1 of FIG. 1. For comparison, the conduction band profile of a conventional structure lacking the undoped GaAs layer 112 on the wide-recess stopper layer 111 is indicated by a dashed line in FIG. 2. As shown, in the structure shown in FIG. 1, two-dimensional electron gas formed in the undoped GaAs layer 112 lowers the potential barrier and thereby increases the probability that electrons pass through the potential barrier of the stopper layer 111. In addition, because no impurities are doped in the GaAs layer 112, the scattering by ionized impurities is suppressed and electron mobility is high in the layer 112. Consequently, the contact resistance from the cap layer 113 to the channel layer 106 is successfully reduced. Further, the increase of this sheet resistance is suppressed because the gate contact layer 109 is not exposed to the outside.

With the structure of FIG. 1, an ON resistance as low as 1.4 Ω·mm was achieved. This ON resistance is lower than the ON resistance of conventional FETs by 0.2 Ω·mm.

2nd Embodiment

Figure 3:
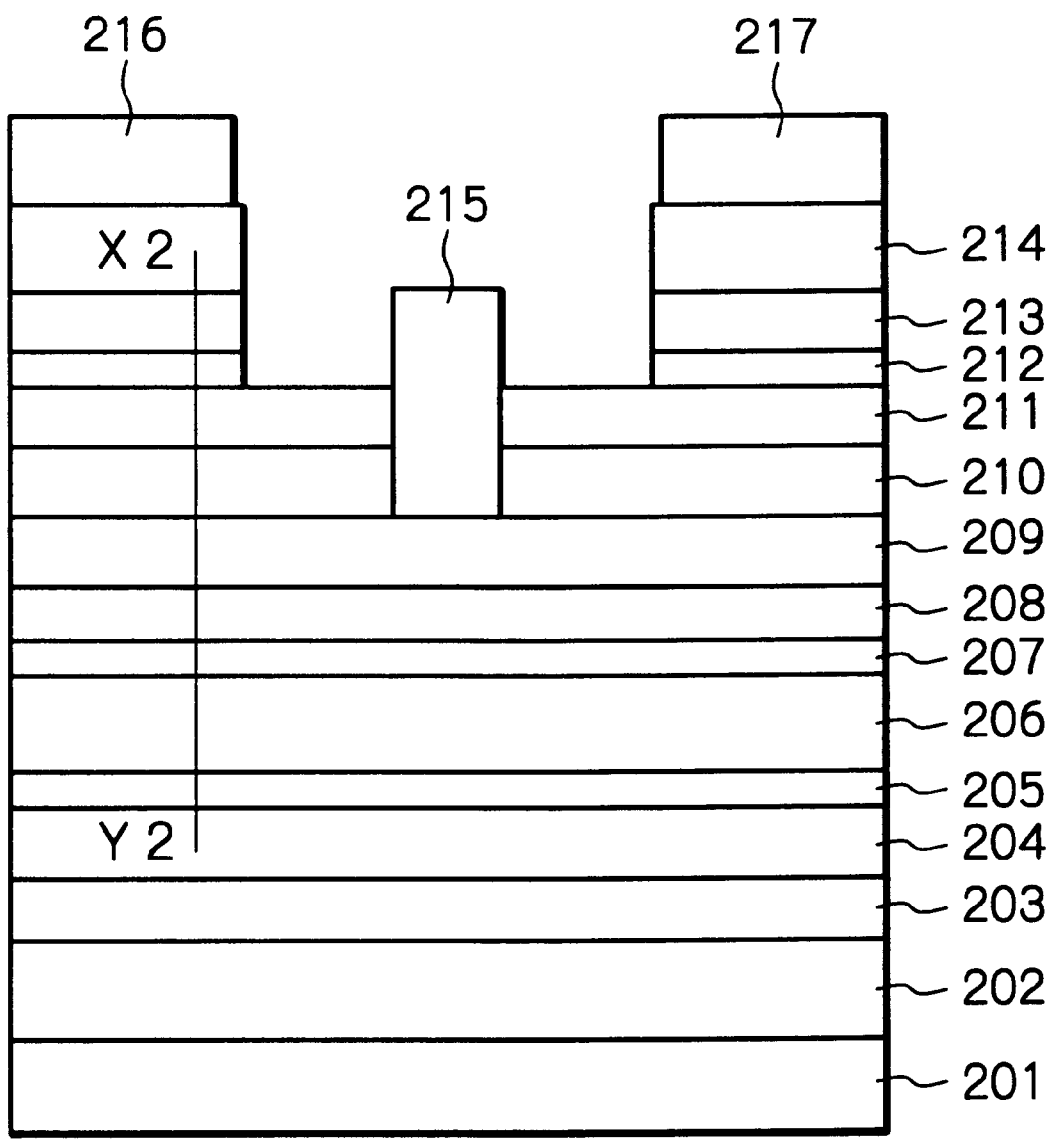
FIG. 3 is a section showing a second embodiment of the present invention.

A second embodiment of the FET in accordance with the present invention is shown in FIG. 3 and includes a semi-insulating GaAs substrate 201. As shown, there are sequentially formed on the substrate 201 a 400 nm thick undoped GaAs buffer layer 202, a 100 nm thick undoped $Al_{0.2}Ga_{0.8}As$ buffer layer 203, a 4 nm thick $Al_{0.2}Ga_{0.8}As$ electron supply layer 204 doped with $4\times10^{18}$ $cm^{-3}$ of Si, a 2 nm thick undoped $Al_{0.2}Ga_{0.8}As$ spacer layer 205, a 15 nm thick undoped $In_{0.2}Ga_{0.8}As$ channel layer 206, a 2 nm thick undoped $Al_{0.2}Ga_{0.8}As$ spacer layer 207, a 9 nm thick $Al_{0.2}Ga_{0.8}As$ electron supply layer 208 doped with $4\times10^{18}$ $cm^{-3}$ of Si, a 10 nm thick undoped $Al_{0.2}Ga_{0.8}As$ gate contact layer 209, a 24 nm thick GaAs gate buried layer 210 doped with $5\times10^{16}$ $cm^{-3}$ of Si, a 6 nm thick undoped GaAs layer 211, a 6 nm thick $Al_{0.2}Ga_{0.8}As$ wide-recess stopper layer 212 doped with $4\times10^{18}$ $cm^{-3}$ of Si, a 6 nm thick undoped GaAs layer 213 and a 100 nm thick GaAs cap layer 214 doped with $4\times10^{18}$ $cm^{-3}$ of Si by epitaxial growth. Again, to produce such an epitaxial wafer, use may be made of the MBE scheme or the MOVPE scheme, as desired.

A mask formed with a wide recess pattern is formed on the above epitaxial wafer. Then, the GaAs layers 214 and 213 are selectively etched with the wide-recess stopper layer 212 serving as a stop layer. To so etch the two layers 214 and 213, there may be used dry etching using a mixture of chloride gas containing only chlorine as a halogen element and fluoride gas containing only fluorine, e.g., a $BCl_6$ and $SF_6$ mixture.

After the removal of the above mask, the undoped GaAs layer 211 and GaAs gate buried layer 210 are selectively etched via a new mask formed with a gate recess pattern with the gate contact layer 209 serving as a stopper layer. As a result, the undoped gate contact layer 209 is exposed to the outside. At this instant, the buried layer 212 is not overetched. A gate electrode 215 is formed on the exposed gate contact layer 209. This produces a structure in which no gaps are present at the sides of the gate electrode 215.

Subsequently, a source electrode 216 and a drain electrode 217 are formed by the evaporation lift-off and alloying (e.g. 400° C./1 min) of AuGe, serving as ohmic electrodes.

Figure 4:
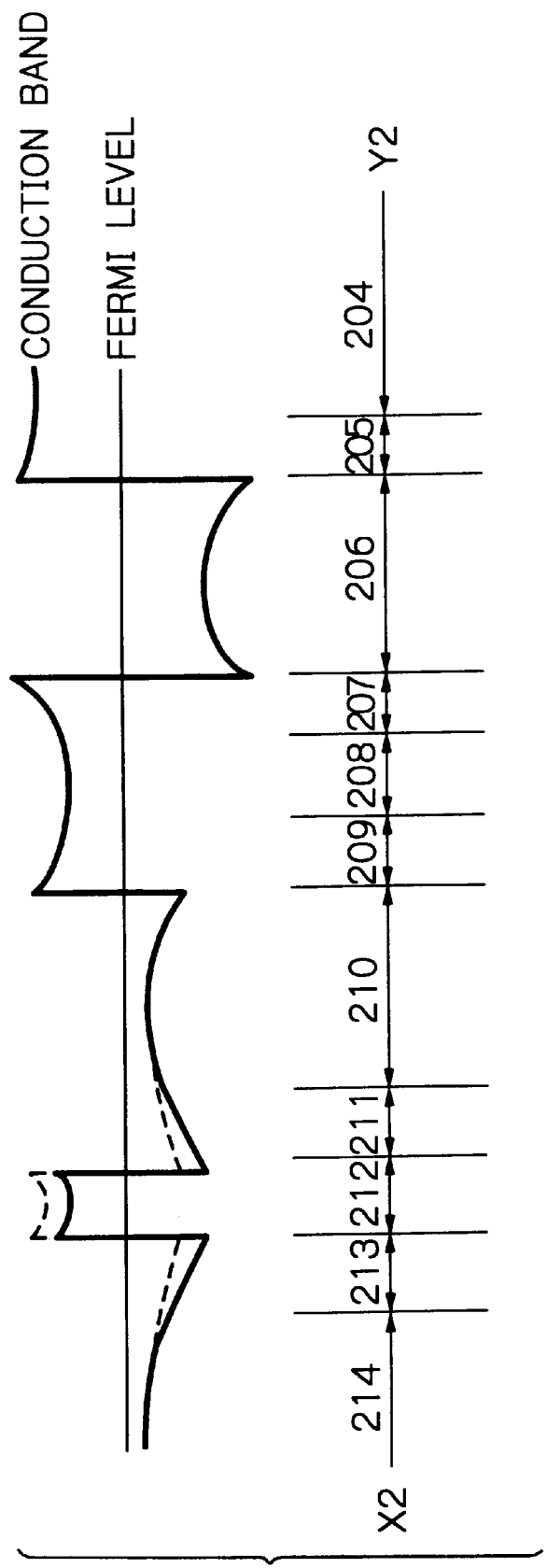
FIG. 4 shows a conduction band profile between a cap layer and a channel layer included in the second embodiment.

FIG. 4 shows a conduction band profile in a direction X2–Y2 of FIG. 3. For comparison, the conduction band profile of a conventional structure lacking the undoped GaAs layers 213 and 211 respectively present on the top and bottom of the wide-recess stopper layer 212 is indicated by a dashed line in FIG. 2. As shown, in the structure shown in FIG. 3, two-dimensional electron gas formed in the undoped GaAs layers 213 and 211 lowers the potential barrier and thereby increases the probability that electrons pass through the potential barrier of the stopper layer 212. In addition, because no impurities are doped in the GaAs layer 213 or 211, the scattering by ionized impurities is suppressed and electron mobility is high in the layers 213 and 211. Consequently, the contact resistance from the cap layer 214 to the channel layer 206 is successfully reduced. Further, the increase of this sheet resistance is suppressed because the gate contact layer 209 is not exposed to the outside.

With the structure of FIG. 3, an ON resistance as low as 1.3 Ω·mm was achieved. This ON resistance is lower than the ON resistance of conventional FETs by 0.3 Ω·mm.

3rd Embodiment

Figure 5:
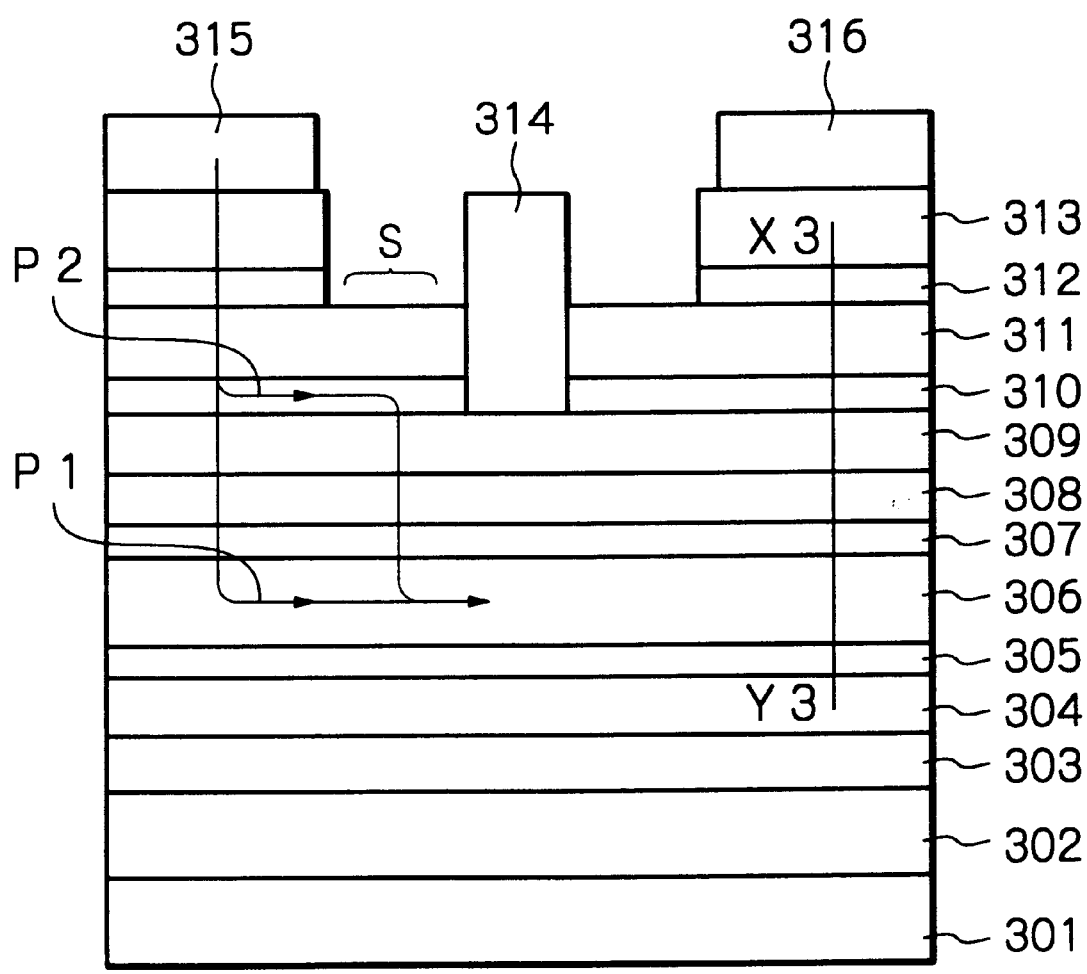
FIG. 5 is a section showing a third embodiment of the present invention.

A third embodiment of the FET in accordance with the present invention is shown in FIG. 5 and includes a semi-insulating GaAs substrate 301. As shown, there are sequentially formed on the substrate 301 a 400 nm thick undoped GaAs buffer layer 302, a 100 nm thick undoped $Al_{0.2}Ga_{0.8}As$ buffer layer 303, a 4 nm thick $Al_{0.2}Ga_{0.8}As$ electron supply layer 304 doped with $4 \times 10^{18}$ cm$^{-3}$ of Si, a 2 nm thick undoped $Al_{0.2}Ga_{0.8}As$ spacer layer 305, a 15 nm thick undoped $In_{0.2}Ga_{0.8}As$ channel layer 306, a 2 nm thick undoped $Al_{0.2}Ga_{0.8}As$ spacer layer 307, a 9 nm thick $Al_{0.2}Ga_{0.8}As$ electron supply layer 308 doped with $4 \times 10^{18}$ cm$^{-3}$ of Si, a 10 nm thick $Al_{0.2}Ga_{0.8}As$ gate contact layer 309 doped with $4 \times 10^{18}$ cm$^{-3}$ of Si, a 6 nm thick undoped GaAs gate buried layer 310, a 24 nm thick GaAs gate buried layer 311 doped with $5 \times 10^{16}$ cm$^{-3}$ of Si, a 6 nm thick $Al_{0.2}Ga_{0.8}As$ wide-recess stopper layer 312 doped with $4 \times 10^{18}$ cm$^{-3}$ of Si and a 100 nm thick GaAs cap layer 214 doped with $4 \times 10^{18}$ cm$^{-3}$ of Si by epitaxial growth. To produce such an epitaxial wafer, use may be made of the MBE scheme or the MOVPE scheme, as desired.

A mask formed with a wide recess pattern is formed on the above epitaxial wafer. Then, the GaAs layer 313 is selectively etched with the wide-recess stopper layer 312 serving as a stopper layer. To so etch the GaAs layer 313, there may be used dry etching using a mixture of chloride gas containing only chlorine as a halogen element and fluoride gas containing only fluorine, e.g., a $BCl_6$ and $SF_6$ mixture.

After the removal of the above mask, the GaAs layers 311 and 310 are selectively etched via a new mask formed with a gate recess pattern with the gate contact layer 309 serving as a stopper layer. As a result, the gate contact layer 309 is exposed to the outside. At this instant, the gate buried layers 311 and 310 are not overetched. A gate electrode 314 is formed on the exposed gate contact layer 309. This produces a structure in which no gaps are present at the sides of the gate electrode 314.

Subsequently, a source electrode 315 and a drain electrode 316 are formed by the evaporation lift-off and alloying (e.g. 400° C./1 min) of AuGe, serving as ohmic electrodes.

Figure 6:
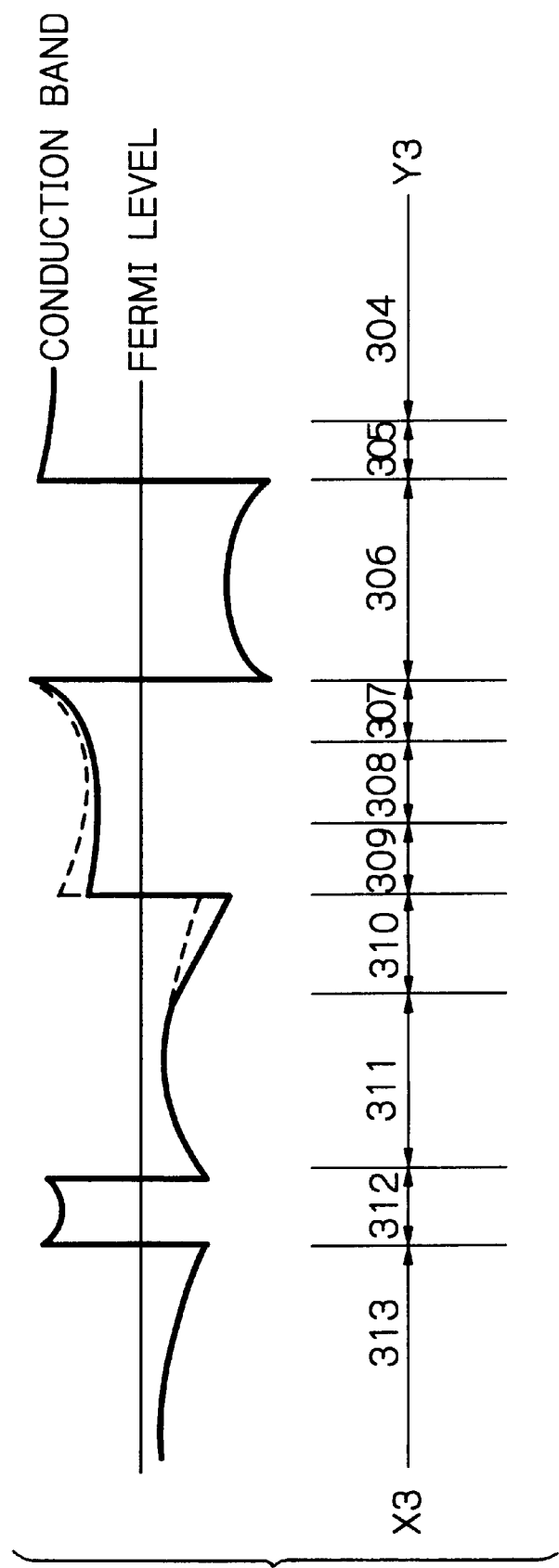
FIG. 6 shows a conduction band profile between a cap layer and a channel layer included in the third embodiment.

FIG. 6 shows a conduction band profile in a direction X3–Y3 of FIG. 5. For comparison, the conduction band profile of a conventional structure including an undoped gate contact layer, but lacking the undoped GaAs layer 310, is indicated by a dashed line in FIG. 6. As shown, in the structure shown in FIG. 5, two-dimensional electron gas formed in the undoped GaAs layer 310 lowers the potential barrier and thereby increases the probability that electrons pass through the potential barrier formed by the $Al_{0.2}Ga_{0.8}As$ layers 309, 308 and 307. In addition, because no impurities are doped in the GaAs layer 310, the scattering by ionized impurities is suppressed and electron mobility is high in the layer 310. Consequently, the contact resistance from the cap layer 313 to the channel layer 306 is successfully reduced. Further, two-dimensional electron gas formed in the undoped GaAs layer 310 having high electron mobility forms a low resistance current path (P2, FIG. 5) in addition to a current path (P1, FIG. 5) formed in the channel layer 306. The current path P2 serves to reduce the sheet resistance of the portion (S, FIG. 5) where the GaAs gate buried layer is exposed to the outside. In addition, because the gate contact layer 309 is not exposed to the outside, the sheet resistance at this portion sparingly increases.

With the structure of FIG. 5, an ON resistance as low as 1.3 Ω·mm was achieved. This ON resistance is lower than the ON resistance of conventional FETs by 0.3 Ω·mm.

4th Embodiment

Figure 7:
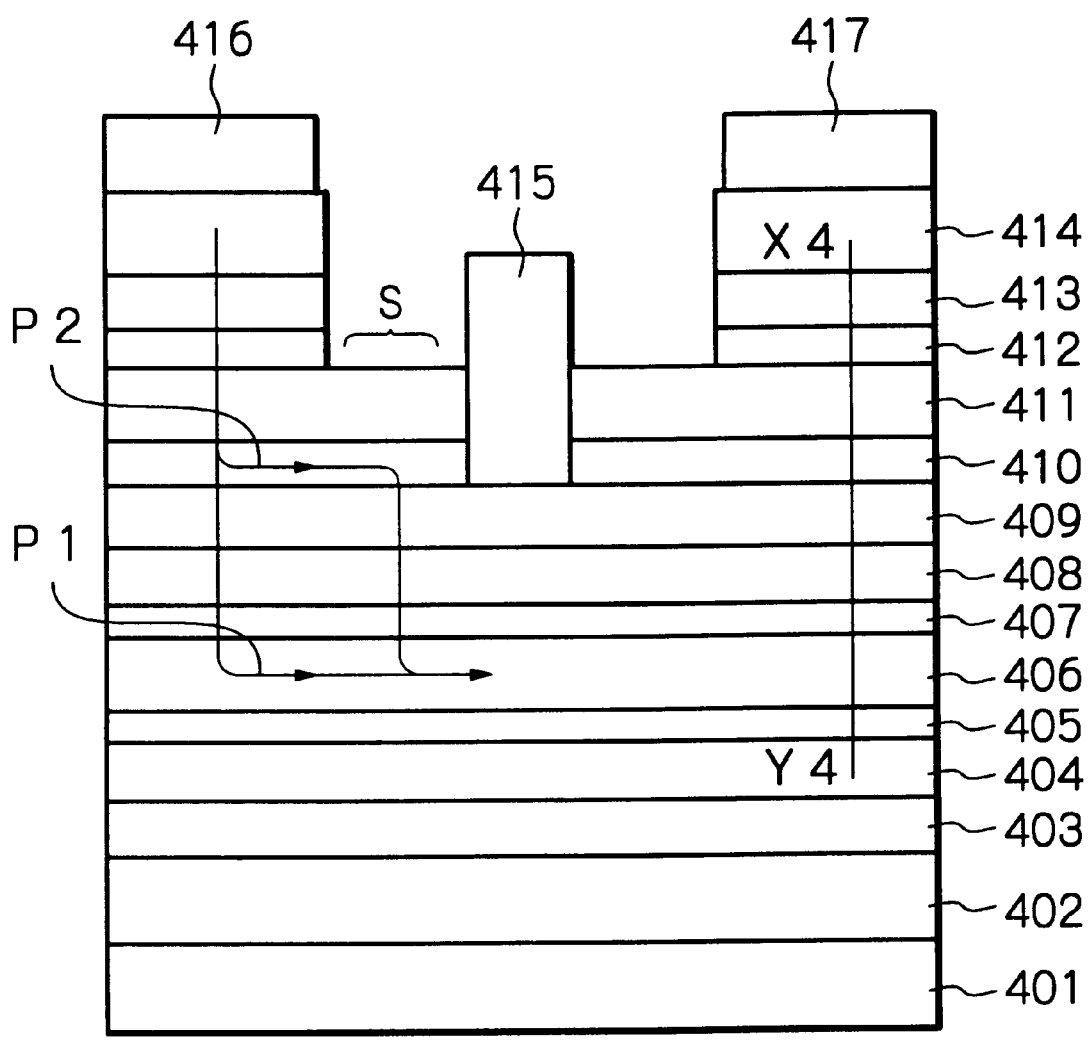
FIG. 7 is a section showing a fourth embodiment of the present invention.

A fourth embodiment of the FET in accordance with the present invention is shown in FIG. 7 and includes a semi-insulating GaAs substrate 401. As shown, there are sequentially formed on the substrate 401 a 400 nm thick undoped GaAs buffer layer 402, a 100 nm thick undoped $Al_{0.2}Ga_{0.8}As$ buffer layer 403, a 4 nm thick $Al_{0.2}Ga_{0.8}As$ electron supply layer 404 doped with $4 \times 10^{18}$ cm$^{-3}$ of Si, a 2 nm thick undoped $Al_{0.2}Ga_{0.8}As$ spacer layer 405, a 15 nm thick undoped $In_{0.2}Ga_{0.8}As$ channel layer 406, a 2 nm thick undoped $Al_{0.2}Ga_{0.8}As$ spacer layer 407, a 9 nm thick $Al_{0.2}Ga_{0.8}As$ electron supply layer 408 doped with $4 \times 10^{18}$ cm$^{-3}$ of Si, a 10 nm thick $Al_{0.2}Ga_{0.8}As$ gate contact layer 409 doped with $5 \times 10^{17}$ cm$^{-3}$ of Si, a 6 nm thick undoped GaAs gate buried layer 410, a 24 nm thick GaAs gate buried layer 411 doped with $5 \times 10^{16}$ cm$^{-3}$ of Si, a 6 nm thick $Al_{0.2}Ga_{0.8}As$ wide-recess stopper layer 412 doped with $4 \times 10^{18}$ cm$^{-3}$ of Si, a 6 nm thick undoped GaAs layer 413 and a 100 nm thick GaAs cap layer 414 doped with $4 \times 10^{18}$ cm$^{-3}$ of Si by epitaxial growth. To produce such an epitaxial wafer, use may be made of the MBE scheme or the MOVPE scheme, as desired.

A mask formed wide a wide recess pattern is formed on the above epitaxial wafer. Then, the GaAs layers 414 and 413 are selectively etched with the wide-recess stopper layer 412 serving as a stopper layer. To so etch the GaAs layers 414 and 413, there may be used dry etching using a mixture of chloride gas containing only chlorine as a halogen element and fluoride gas containing only fluorine, e.g., a $BCl_3$ and $SF_6$ mixture.

After the removal of the above mask, the GaAs layers 411 and 410 are selectively etched via a new mask formed with a gate recess pattern with the gate contact layer 409 serving as a stopper layer. As a result, the gate contact layer 409 is exposed to the outside. At this instant, the gate buried layers 411 and 410 are not overetched. A gate electrode 414 is formed on the exposed gate contact layer 409. This produces a structure in which no gaps are present at the sides of the gate electrode 414.

Subsequently, a source electrode 416 and a drain electrode 417 are formed by the evaporation lift-off and alloying (e.g. 400° C./1 min) of AuGe, serving as ohmic electrodes.

Figure 8:
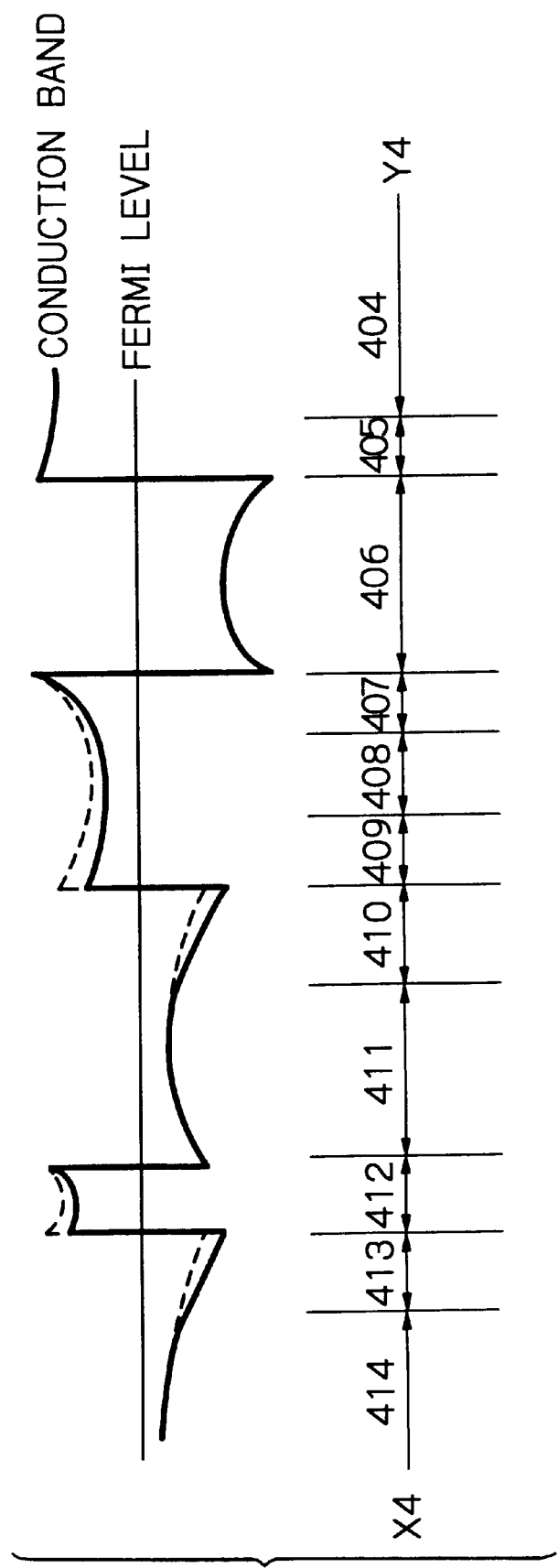
FIG. 8 shows a conduction band profile between a cap layer and a channel layer included in the fourth embodiment.

FIG. 8 shows a conduction band profile in a direction X4–Y4 of FIG. 7. For comparison, the conduction band profile of a conventional structure including an undoped gate contact layer, but lacking the undoped GaAs layers 410 and 413, is indicated by a dashed line in FIG. 8. As shown, in the structure shown in FIG. 7, two-dimensional electron gas formed in the undoped GaAs layers 410 and 413 lowers the potential barrier and thereby increases the probability that electrons pass through the potential barrier of the $Al_{0.2}Ga_{0.8}As$ layer 412 and a potential barrier formed by the $Al_{0.2}Ga_{0.8}As$ layers 409, 408 and 407. In addition, because no impurities are doped in the GaAs layer 410 or 413, the scattering by ionized impurities is suppressed and electron mobility is high in the layers 410 and 413. Consequently, the contact resistance from the cap layer 414 to the channel layer 406 is successfully reduced. Further, two-dimensional electron gas formed in the undoped GaAs layer 410 having great electron mobility forms a low resistance current path (P2, FIG. 7) in addition to a current path (P1, FIG. 7) formed in the channel layer 406. The current path P2 serves to reduce the sheet resistance of the portion (S, FIG. 7) where the GaAs gate buried layer is exposed to the outside. In addition, because the gate contact layer 409 is not exposed to the outside, the sheet resistance at this portion sparingly increases.

With the structure of FIG. 7, an ON resistance as low as 1.2 Ω·mm was achieved. This ON resistance is lower than the ON resistance of conventional FETs by 0.4 Ω·mm.

5th Embodiment

Figure 9:
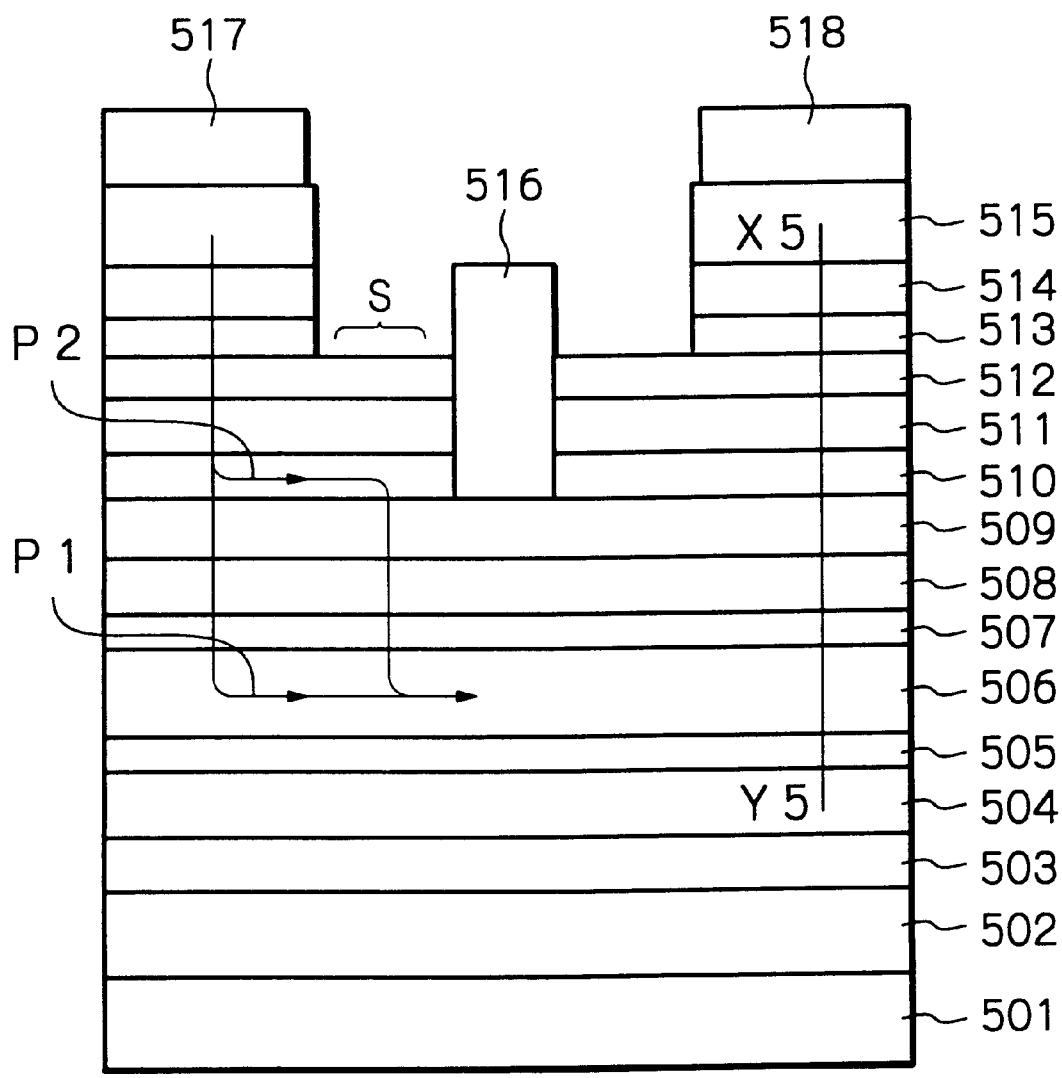
FIG. 9 is a section showing a fifth embodiment of the present invention.

A fifth embodiment of the FET in accordance with the present invention is shown in FIG. 9 and includes a semi-insulating GaAs substrate 501. As shown, there are sequentially formed on the substrate 501 a 400 nm thick undoped GaAs buffer layer 502, a 100 nm thick undoped $Al_{0.2}Ga_{0.8}As$ buffer layer 503, a 4 nm thick $Al_{0.2}Ga_{0.8}As$ electron supply layer 504 doped with $4\times10^{18}$ $cm^{-3}$ of Si, a 2 nm thick undoped $Al_{0.2}Ga_{0.8}As$ spacer layer 505, a 15 nm thick undoped $In_{0.2}Ga_{0.8}As$ channel layer 506, a 2 nm thick undoped $Al_{0.2}Ga_{0.8}As$ spacer layer 507, a 9 nm thick $Al_{0.2}Ga_{0.8}As$ electron supply layer 508 doped with $4\times10^{18}$ $cm^{-3}$ of Si, a 10 nm thick $Al_{0.2}Ga_{0.8}As$ gate contact layer 509 doped with $5\times10^{17}$ $cm^{-3}$ of Si, a 6 nm thick undoped GaAs gate buried layer 510, a 18 nm thick GaAs gate buried layer 511 doped with $5\times10^{16}$ $cm^{-3}$ of Si, a 6 nm thick undoped GaAs gate buried layer 512, a 6 nm thick $Al_{0.2}Ga_{0.8}As$ wide-recess stopper layer 513 doped with $4\times10^{18}$ $cm^{-3}$ of Si, a 6 nm thick undoped GaAs layer 514 and a 100 nm thick GaAs cap layer 515 doped with $4\times10^{18}$ $cm^{-3}$ of Si by epitaxial growth. To produce such an epitaxial wafer, use may be made of the MBE scheme or the MOVPE scheme, as desired.

A mask formed with a wide recess pattern is formed on the above epitaxial wafer. Then, the GaAs layers 515 and 514 are selectively etched with the wide-recess stopper layer 513 serving as a stopper layer. To so etch the GaAs layers 515 and 514, there may be used dry etching using a mixture of chloride gas containing only chlorine as a halogen element and fluoride gas containing only fluorine, e.g., a $BCl_3$ and $SF_6$ mixture.

After the removal of the above mask, the GaAs layers 512, 511 and 510 are selectively etched via a new mask formed with a gate recess pattern with the gate contact layer 509 serving as a stopper layer. As a result, the gate contact layer 509 is exposed to the outside. At this instant, the gate buried layers 512, 511 and 510 are not overetched. A gate electrode 516 is formed on the exposed gate contact layer 509. This produces a structure in which no gaps are present at the sides of the gate electrode 516.

Subsequently, a source electrode 517 and a drain electrode 518 are formed by the evaporation lift-off and alloying (e.g. 400° C./1 min) of AuGe, serving as ohmic electrodes.

Figure 10:
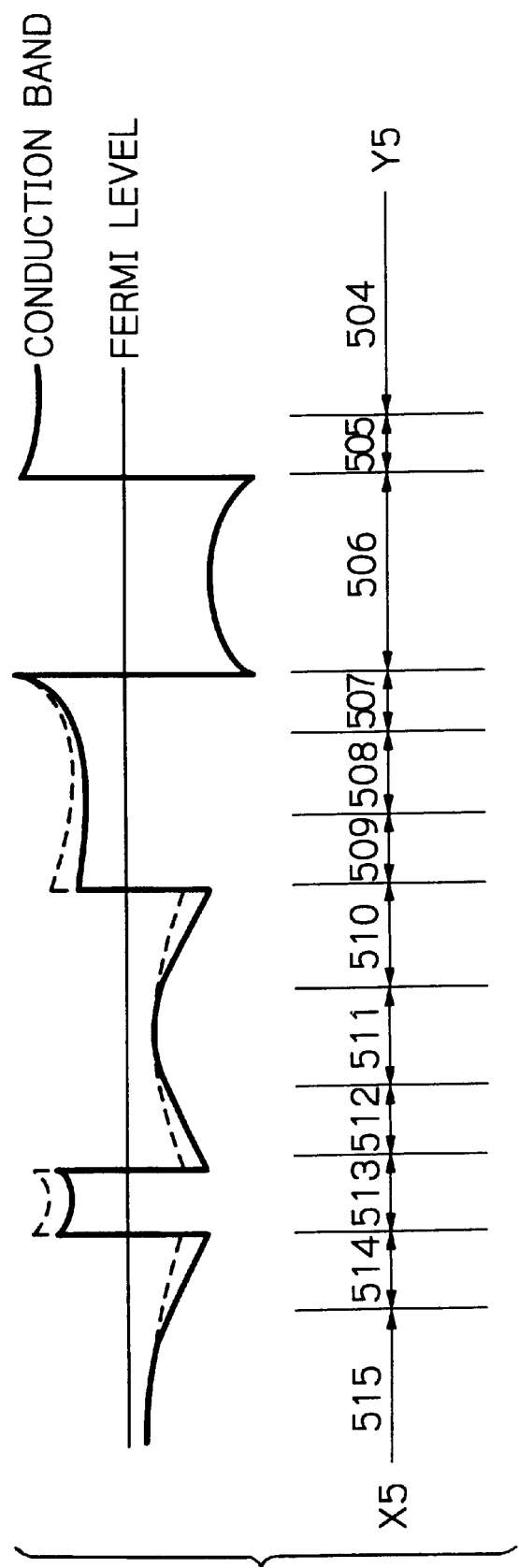
FIG. 10 shows a conduction band profile between a cap layer and a channel layer included in the fifth embodiment.

FIG. 10 shows a conduction band profile in a direction X5–Y5 of FIG. 9. For comparison, the conduction band profile of a conventional structure including an undoped gate contact layer, but lacking the undoped GaAs layers 510, 512 and 514, is indicated by a dashed line in FIG. 10. As shown, in the structure shown in FIG. 9, two-dimensional electron gas formed in the undoped GaAs layers 510, 512 and 514 lowers the potential barrier and thereby increases the probability that electrons pass through the potential barrier of the $Al_{0.2}Ga_{0.8}As$ layer 513 and a potential barrier formed by the $Al_{0.2}Ga_{0.8}As$ layers 509, 508 and 507. In addition, because no impurities are doped in the GaAs layer 510, 512 or 514, the scattering by ionized impurities is suppressed and electron mobility is high in the layers 510, 512 and 514. Consequently, the contact resistance from the cap layer 515 to the channel layer 506 is successfully reduced. Further, two-dimensional electron gas formed in the undoped GaAs layer 510 having great electron mobility forms a low resistance current path (P2, FIG. 9) in addition to a current path (P1, FIG. 9) formed in the channel layer 506. The current path P2 serves to reduce the sheet resistance of the portion (S, FIG. 9) where the GaAs gate buried layer is exposed to the outside. In addition, because the gate contact layer 509 is not exposed to the outside, the sheet resistance increase of this portion is suppressed.

With the structure of FIG. 9, an ON resistance as low as 1.1 Ω·mm was achieved. This ON resistance is lower than the ON resistance of conventional FETs by 0.5 Ω·mm.

6th Embodiment

Figure 11:
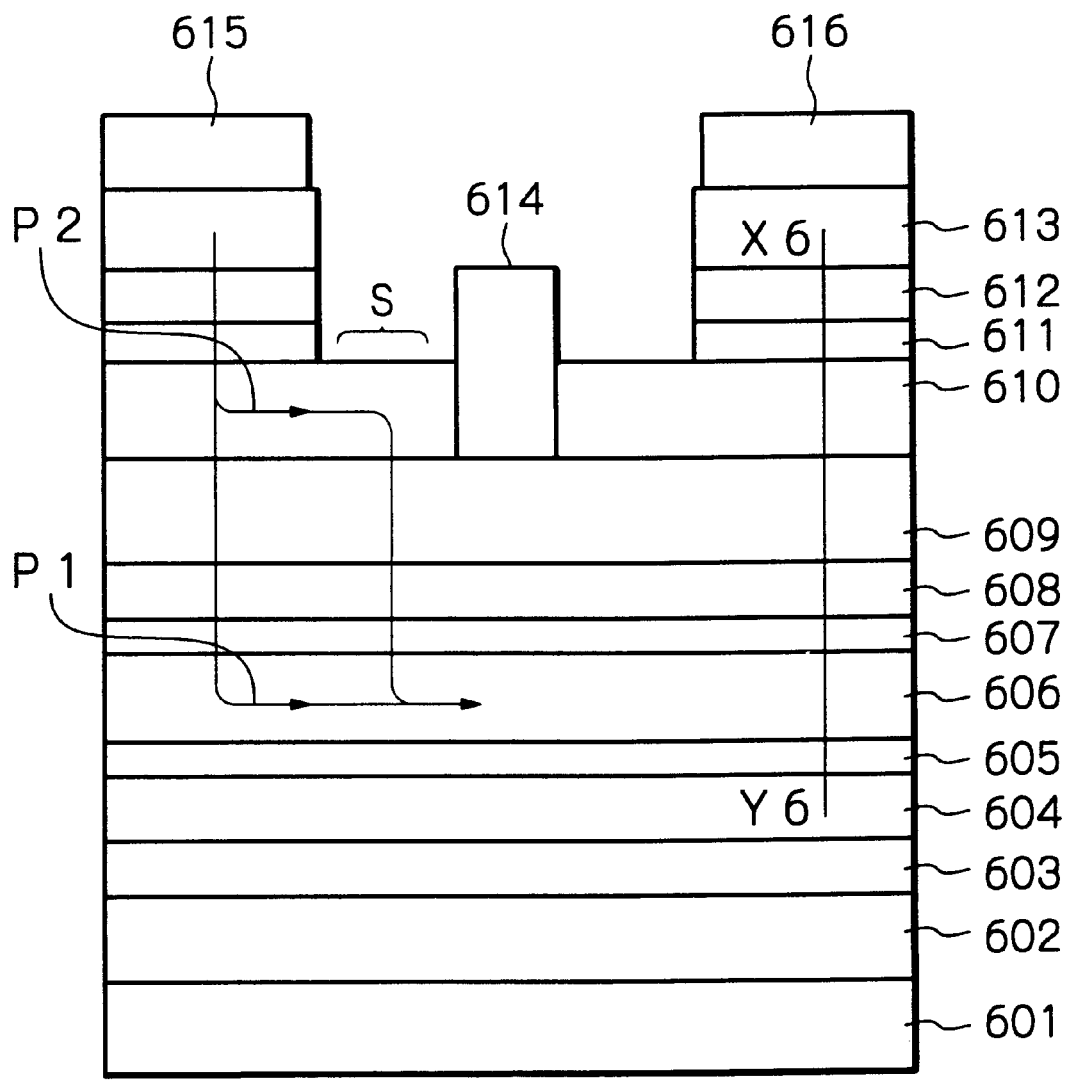
FIG. 11 is a section showing a sixth embodiment of the present invention.

A sixth embodiment of the FET in accordance with the present invention is shown in FIG. 11 and includes a semi-insulating GaAs substrate 601. As shown, there are sequentially formed on the substrate 601 a 400 nm thick undoped GaAs buffer layer 602, a 100 nm thick undoped $Al_{0.2}Ga_{0.8}As$ buffer layer 603, a 4 nm thick $Al_{0.2}Ga_{0.8}As$ electron supply layer 604 doped with $4\times10^{18}$ $cm^{-3}$ of Si, a 2 nm thick undoped $Al_{0.2}Ga_{0.8}As$ spacer layer 605, a 15 nm thick undoped $In_{0.2}Ga_{0.8}As$ channel layer 606, a 2 nm thick undoped $Al_{0.2}Ga_{0.8}As$ spacer layer 607, a 9 nm thick $Al_{0.2}Ga_{0.8}As$ electron supply layer 608 doped with $4\times10^{18}$ $cm^{-3}$ of Si, a 25 nm thick $Al_{0.2}Ga_{0.8}As$ gate contact layer 609 doped with $5\times10^{17}$ $cm^{-3}$ of Si, a 15 nm thick undoped GaAs gate buried layer 610, a 6 nm thick $Al_{0.2}Ga_{0.8}As$ wide-recess stopper layer 611 doped with $4\times10^{18}$ $cm^{-3}$ of Si, a 6 nm thick undoped GaAs layer 612 and a 100 nm thick GaAs cap layer 613 doped with $4\times10^{18}$ $cm^{-3}$ of Si by epitaxial growth. To produce such an epitaxial wafer, use may be made of the MBE scheme or the MOVPE scheme, as desired.

A mask formed with a wide recess pattern is formed on the above epitaxial wafer. Then, the GaAs layers 613 and 612 are selectively etched with the wide-recess stopper layer 611 serving as a stopper layer. To so etch the GaAs layers 613 and 612, there may be used dry etching using a mixture of chloride gas containing only chlorine as a halogen element and fluoride gas containing only fluorine, e.g., a $BCl_3$ and $SF_6$ mixture.

After the removal of the above mask, the GaAs layer 610 is selectively etched via a new mask formed with a gate recess pattern with the gate contact layer 609 serving as a stopper layer. As a result, the gate contact layer 609 is exposed to the outside. At this instant, the gate buried layer 610 is not overetched. A gate electrode 614 is formed on the exposed gate contact layer 609. This produces a structure in which no gaps are present at the sides of the gate electrode 614.

Subsequently, a source electrode 615 and a drain electrode 616 are formed by the evaporation lift-off and alloying (e.g. 400° C./1 min) of AuGe, serving as ohmic electrodes.

Figure 12:
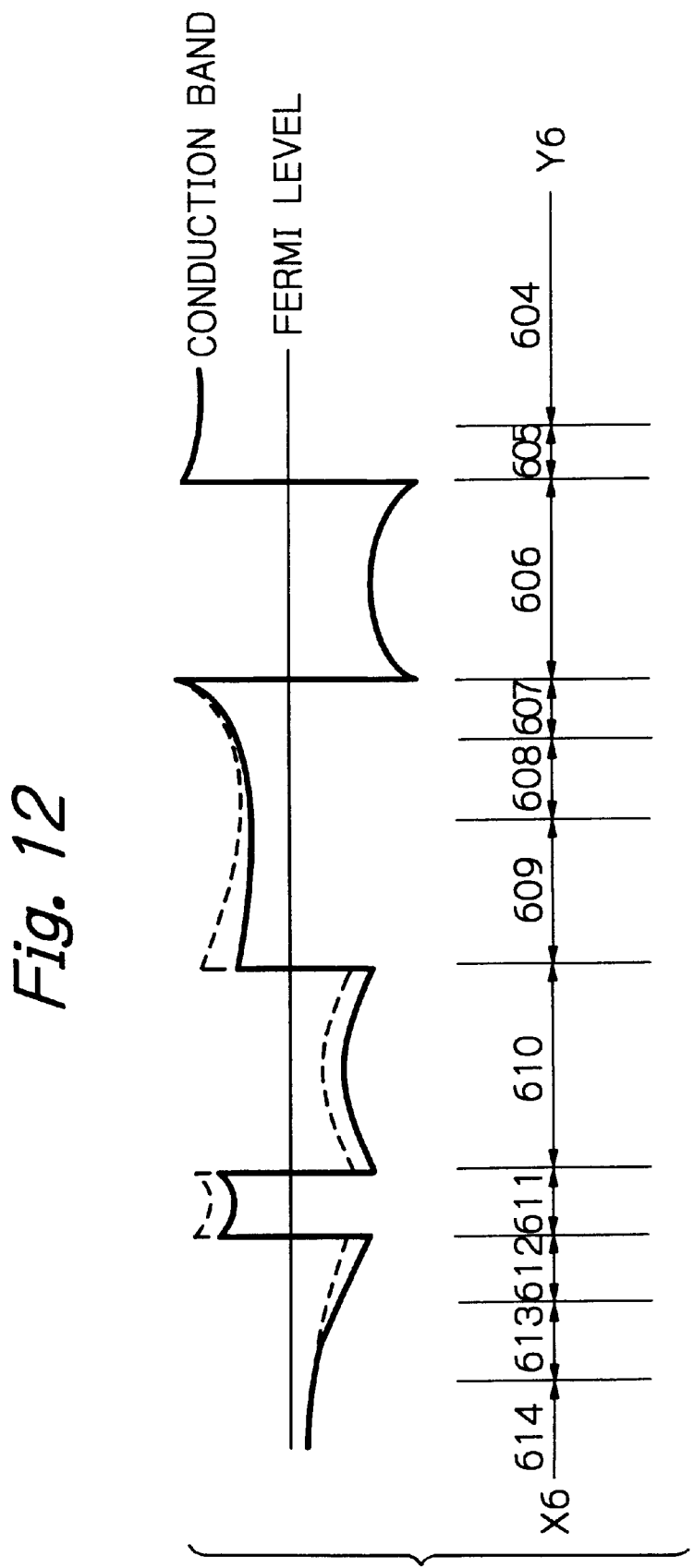
FIG. 12 shows a conduction band profile between a cap layer and a channel layer included in the sixth embodiment.

FIG. 12 shows a conduction band profile in a direction X6-Y6 of FIG. 11. For comparison, the conduction band profile of a conventional structure including an undoped gate contact layer and the GaAs layer 610 doped with an n-type impurity, but lacking the undoped GaAs layer 612, is indicated by a dashed line in FIG. 12. As shown, in the structure shown in FIG. 11, two-dimensional electron gas formed in the undoped GaAs layers 610 and 612 lowers the potential barrier and thereby increases the probability that electrons pass through the potential barrier of the $Al_{0.2}Ga_{0.8}As$ layer 611 and a potential barrier formed by the $Al_{0.2}Ga_{0.8}As$ layers 609, 608 and 607. In addition, because no impurities are doped in the GaAs layer 612 or 610, the scattering by ionized impurities is suppressed and electron mobility is high in the layers 612 and 610. Consequently, the contact resistance from the cap layer 614 to the channel layer 606 is successfully reduced. Further, two-dimensional electron gas formed in the undoped GaAs layer 610 having high electron mobility forms a low resistance current path (P2, FIG. 11) in addition to a current path (P1, FIG. 11) formed in the channel layer 606. The current path P2 serves to reduce the sheet resistance of the portion (S, FIG. 11) where the GaAs gate buried layer is exposed to the outside. In addition, because the gate contact layer 609 is not exposed to the outside, the sheet resistance increase of this portion is suppressed.

With the structure of FIG. 11, an ON resistance as low as 1.1 Ω·mm was achieved. This ON resistance is lower than the ON resistance of conventional FETs by 0.5 Ω·mm.

7th Embodiment

Figure 13:
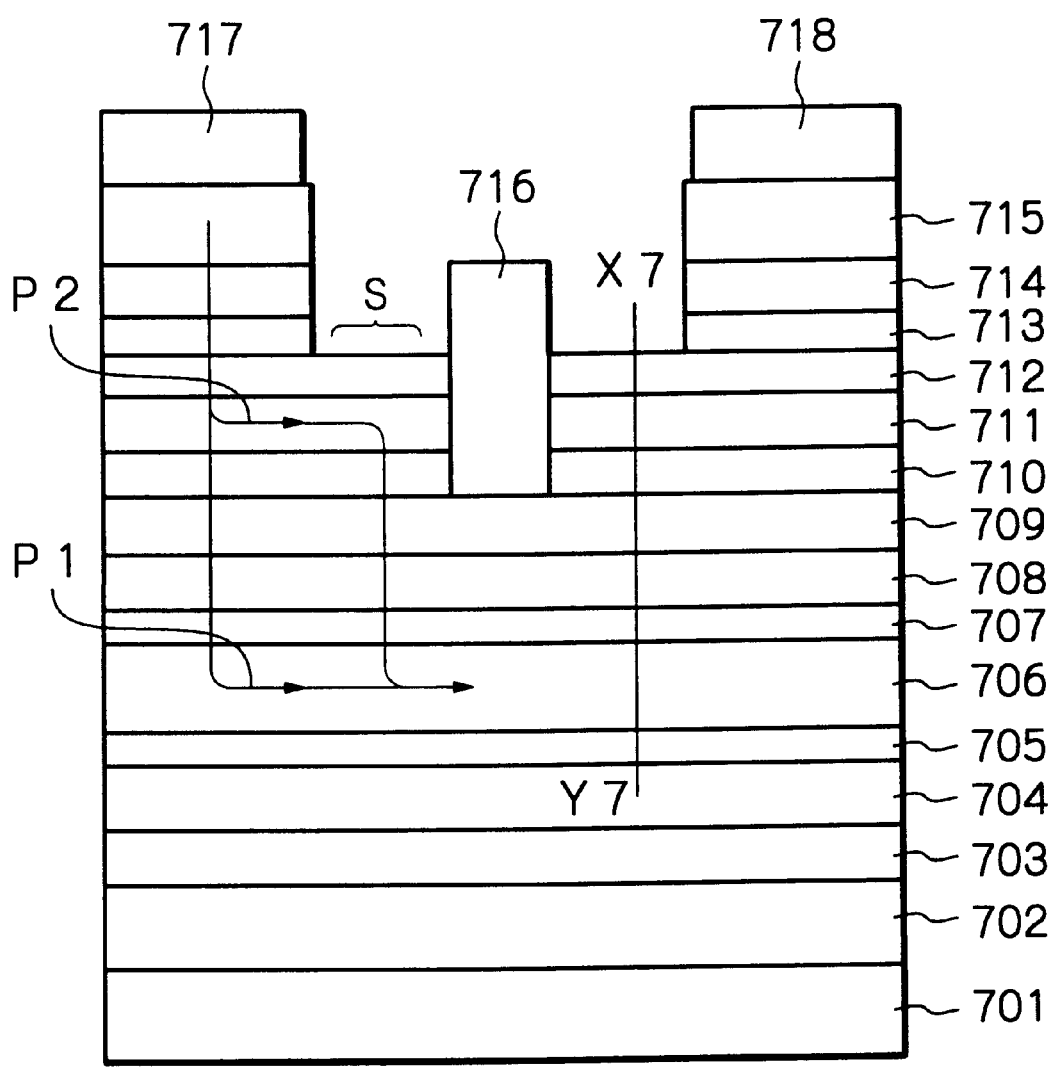
FIG. 13 is a section showing a seventh embodiment of the present invention.

A seventh embodiment of the FET in accordance with the present invention is shown in FIG. 13 and includes a semi-insulating GaAs substrate 701. As shown, there are sequentially formed on the substrate 701 a 400 nm thick undoped GaAs buffer layer 702, a 100 nm thick undoped $Al_{0.2}Ga_{0.8}As$ buffer layer 703, a 4 nm thick $Al_{0.2}Ga_{0.8}As$ electron supply layer 704 doped with $4\times10^{18}$ $cm^{-3}$ of Si, a 2 nm thick undoped $Al_{0.2}Ga_{0.8}As$ spacer layer 705, a 15 nm thick undoped $In_{0.2}Ga_{0.8}As$ channel layer 706, a 2 nm thick undoped $Al_{0.2}Ga_{0.8}As$ spacer layer 707, a 9 nm thick $Al_{0.2}Ga_{0.8}As$ electron supply layer 708 doped with $4\times10^{18}$ $cm^{-3}$ of Si, a 10 nm thick undoped $Al_{0.2}Ga_{0.8}As$ gate contact layer 709, a 20 nm thick GaAs gate buried layer 710 doped with $5\times10^{16}$ $cm^{-3}$ of Si, a 6 nm thick GaAs gate buried layer 711 doped with $1\times10^{18}$ $cm^{-3}$ of Si, a 4 nm thick GaAs gate buried layer 712 doped with $5\times10^{10}$ $cm^{-3}$ of Si, a 6 nm thick $Al_{0.2}Ga_{0.8}As$ wide-recess stopper layer 713 doped with $4\times10^{18}$ $cm^{-3}$ of Si, a 6 nm thick undoped GaAs layer 714 and a 100 nm thick GaAs cap layer 715 doped with $4\times10^{18}$ $cm^{-3}$ of Si by epitaxial growth. To produce such an epitaxial wafer, use may be made of the MBE scheme or the MOVPE scheme, as desired.

A mask formed with a wide recess pattern is formed on the above epitaxial wafer. Then, the GaAs layers 715 and 714 are selectively etched with the wide-recess stopper layer 713 serving as a stopper layer. To so etch the GaAs layers 715 and 714, there may be used dry etching using a mixture of chloride gas containing only chlorine as a halogen element and fluoride gas containing only fluorine, e.g., a $BCl_3$ and $SF_6$ mixture.

After the removal of the above mask, the GaAs layers 712, 711 and 710 are selectively etched via a new mask formed with a gate recess pattern with the gate contact layer 709 serving as a stopper layer. As a result, the gate contact layer 709 is exposed to the outside. At this instant, the gate buried layers 712, 711 and 710 are not overetched. A gate electrode 716 is formed on the exposed gate contact layer 709. This produces a structure in which no gaps are present at the sides of the gate electrode 716.

Subsequently, a source electrode 717 and a drain electrode 718 are formed by the evaporation lift-off and alloying (e.g. 400° C./1 min) of AuGe, serving as ohmic electrodes.

Figure 14:
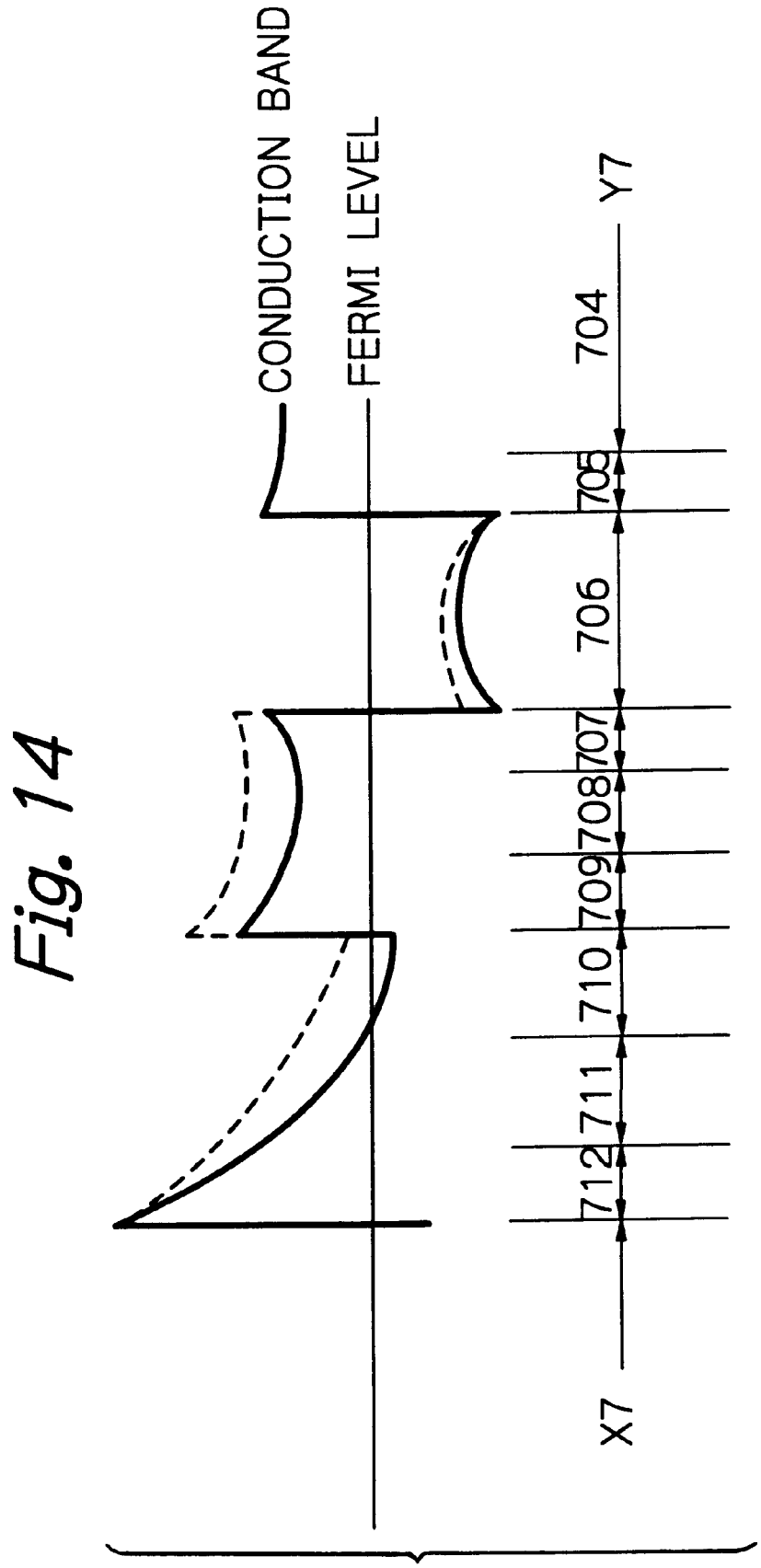
FIG. 14 shows a conduction band profile between an exposed GaAs layer and a channel layer included in the seventh embodiment.

FIG. 14 shows a conduction band profile in a direction X7-Y7 of FIG. 13. For comparison, the conduction band profile of a conventional structure lacking a GaAs layer doped with a high concentration, n-type impurity is indicated by a dashed line in FIG. 14. As shown, in the structure shown in FIG. 13, a depletion layer tending to extend from the surface of the GaAs layer 712 toward the channel side stops in the GaAs layers 712, 711 and 710. This is successful to obstruct the rise of a conduction band at the surface side in the channel, so that a great amount of electrons can be stored in the above layer. Further, a current path is formed not only in the channel (P1, FIG. 13) but also in the gate buried layer (P2, FIG. 13), so that the sheet resistance is reduced in the exposed portion of the GaAs gate buried layer (S, FIG. 13).

Moreover, two-dimensional electron gas formed in the undoped GaAs layer 714 lowers the potential barrier of the $Al_{0.2}Ga_{0.8}As$ layer 713 and thereby increases the probability that electrons pass through the potential barrier of the $Al_{0.2}Ga_{0.8}As$ layer 713. In addition, because no impurities are doped in the GaAs layer 714, the scattering by ionized impurities is suppressed and electron mobility is high in the layer. Consequently, the contact resistance from the cap layer 715 to the channel layer 706 is successfully reduced. In addition, because the gate contact layer 709 is not exposed to the outside, the sheet resistance increase of this portion is suppressed.

With the structure of FIG. 13, an ON resistance as low as 1.2 Ω·mm was achieved. This ON resistance is lower than the ON resistance of conventional FETs by 0.4 Ω·mm.

8th Embodiment

Figure 15:
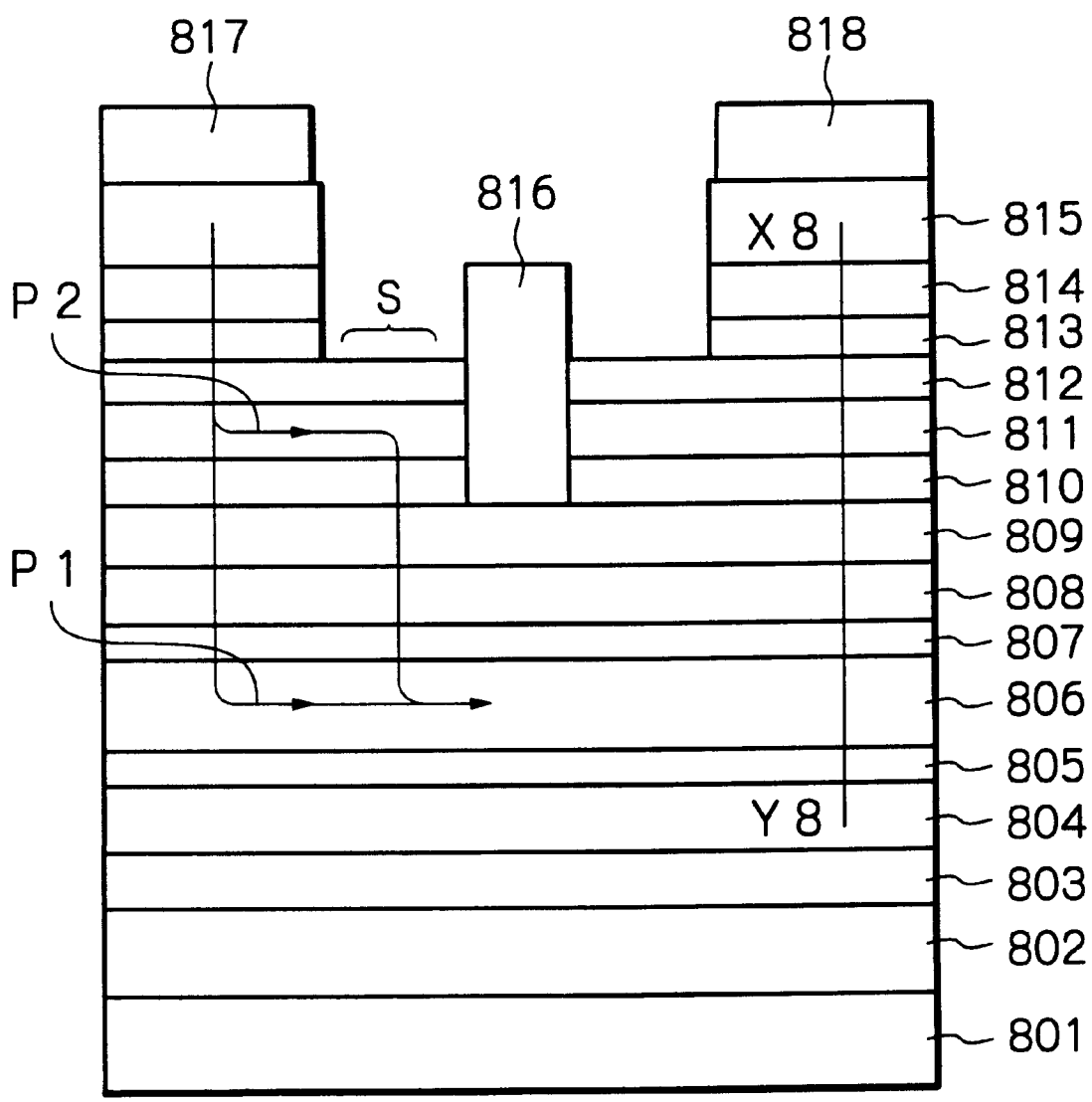
FIG. 15 is a section showing an eighth embodiment of the present invention.

An eighth embodiment of the FET in accordance with the present invention is shown in FIG. 15 and includes a semi-insulating GaAs substrate 801. As shown, there are sequentially formed on the substrate 801 a 400 nm thick undoped GaAs buffer layer 802, a 100 nm thick undoped $Al_{0.2}Ga_{0.8}As$ buffer layer 803, a 4 nm thick $Al_{0.2}Ga_{0.8}As$ electron supply layer 804 doped with $4\times10^{18}$ $cm^{-3}$ of Si, a 2 nm thick undoped $Al_{0.2}Ga_{0.8}As$ spacer layer 805, a 15 nm thick undoped $In_{0.2}Ga_{0.8}As$ channel layer 806, a 2 nm thick undoped $Al_{0.2}Ga_{0.8}As$ spacer layer 807, a 9 nm thick $Al_{0.2}Ga_{0.8}As$ electron supply layer 808 doped with $4\times10^{18}$ cm$^{-3}$ of Si, a 10 nm thick undoped $Al_{0.2}Ga_{0.8}As$ gate contact layer 809, a 18 nm thick GaAs gate buried layer 810 doped with $5\times10^{16}$ cm$^{-3}$ of Si, a 6 nm thick GaAs gate buried layer 811 doped with $1\times10^{18}$ cm$^{-3}$ of Si, a 6 nm thick GaAs gate buried layer 812 doped with $5\times10^{16}$ cm$^{-3}$ of Si, a 6 nm thick $Al_{0.2}Ga_{0.8}As$ wide-recess stopper layer 813 doped with $4\times10^{18}$ cm$^{-3}$ of Si, a 6 nm thick undoped GaAs layer 814 and a 100 nm thick GaAs cap layer 815 doped with $4\times10^{18}$ cm$^{-3}$ of Si by epitaxial growth. To produce such an epitaxial wafer, use may be made of the MBE scheme or the MOVPE scheme, as desired.

A mask formed with a wide recess pattern is formed on the above epitaxial wafer. Then, the GaAs layers 815 and 814 are selectively etched with the wide-recess stopper layer 813 serving as a stopper layer. To so etch the GaAs layers 815 and 814, there may be used dry etching using a mixture of chloride gas containing only chlorine as a halogen element and fluoride gas containing only fluorine, e.g., a $BCl_3$ and $SF_6$ mixture.

After the removal of the above mask, the GaAs layers 812, 811 and 810 are selectively etched via a new mask formed with a gate recess pattern with the gate contact layer 809 serving as a stopper layer. As a result, the gate contact layer 809 is exposed to the outside. At this instant, the gate buried layers 812, 811 and 810 are not overetched. A gate electrode 816 is formed on the exposed gate contact layer 809. This produces a structure in which no gaps are present at the sides of the gate electrode 816.

Subsequently, a source electrode 817 and a drain electrode 818 are formed by the evaporation lift-off and alloying (e.g. 400° C./1 min) of AuGe, serving as ohmic electrodes.

Figure 16:
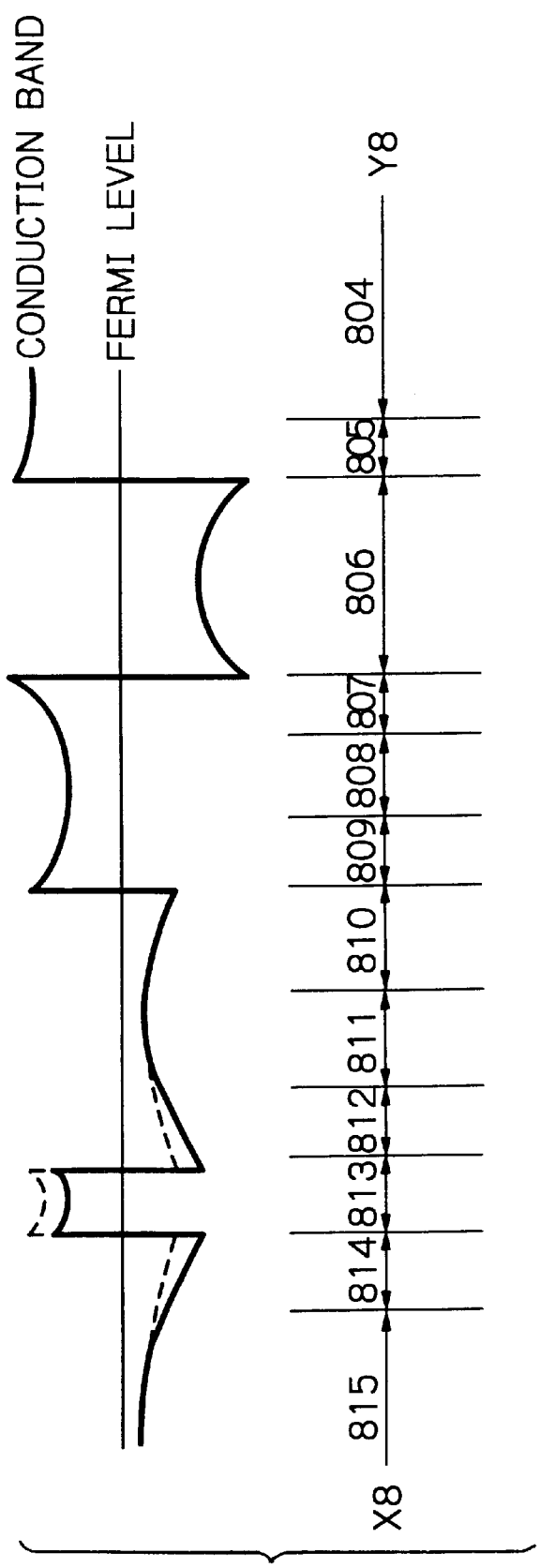
FIG. 16 shows a conduction band profile between a cap layer and a channel layer included in the eighth embodiment.

FIG. 16 shows a conduction band profile in a direction X8–Y8 of FIG. 15. For comparison, the conduction band profile of a conventional structure lacking the undoped GaAs layers 814 and 812 and GaAs layer 811 doped with a high concentration, n-type impurity is indicated by a dashed line in FIG. 15. As shown, in the structure shown in FIG. 15, the high concentration doping of the GaAs layer 811 stops the extension of a depletion layer from the surface of the GaAs layer 812 in the GaAs layers 812, 811 and 810. This is successful to obstruct the rise of a conduction band at the surface side in the channel right below the exposed GaAs layer, so that a great amount of electrons can be stored in the above layer. Further, a current path is formed not only in the channel (P1, FIG. 16) but also in the gate buried layer (P2, FIG. 15), so that the sheet resistance is reduced in the exposed portion of the GaAs gate buried layer (S, FIG. 16).

Moreover, two-dimensional electron gas formed in the undoped GaAs layers 812 and 814 lowers the potential barrier and thereby increases the probability that electrons pass through the potential barrier of the $Al_{0.2}Ga_{0.8}As$ layer 813. In addition, because no impurities are doped in the GaAs layer 812 or 814, the scattering by ionized impurities is suppressed and electron is high in the layers 812 and 814. Consequently, the contact resistance from the cap layer 815 to the channel layer 806 is successfully reduced. In addition, because the gate contact layer 809 is not exposed to the outside, the sheet resistance increase of this portion is suppressed.

With the structure of FIG. 15, an ON resistance as low as 1.1 Ω·mm was achieved. This ON resistance is lower than the ON resistance of conventional FETs by 0.5 Ω·mm.

9th Embodiment

Figure 17:
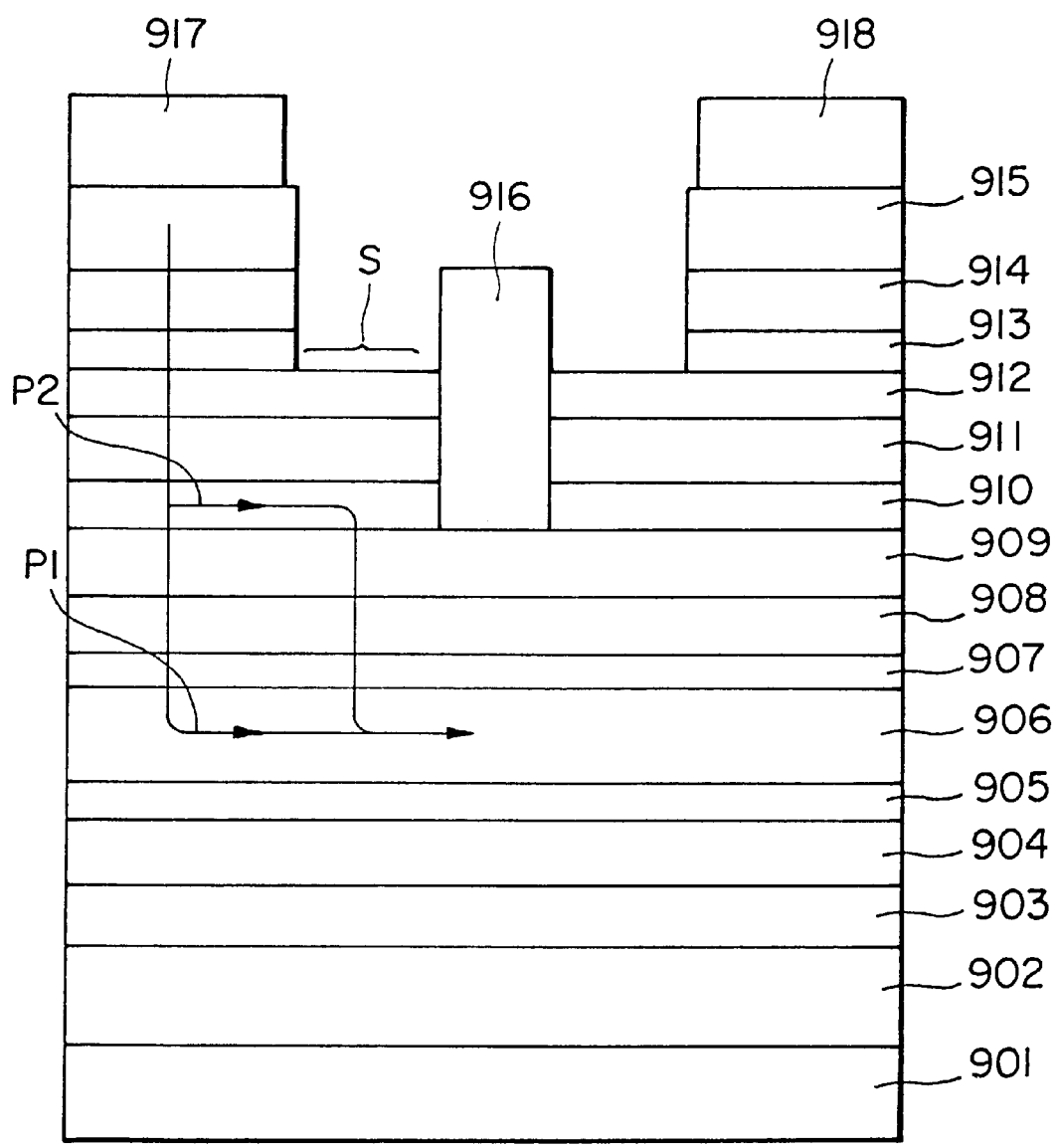
FIG. 17 is a section showing a ninth embodiment of the present invention.

A ninth embodiment of the FET in accordance with the present invention is shown in FIG. 17 and includes a semi-insulating GaAs substrate 901. As shown, there are sequentially formed on the substrate 901 a 400 nm thick undoped GaAs buffer layer 902, a 100 nm thick undoped $Al_{0.2}Ga_{0.8}As$ buffer layer 903, a 4 nm thick $Al_{0.2}Ga_{0.8}As$ electron supply layer 904 doped with $4\times10^{18}$ cm$^{-3}$ of Si, a 2 nm thick undoped $Al_{0.2}Ga_{0.8}As$ spacer layer 905, a 15 nm thick undoped $In_{0.2}Ga_{0.8}As$ channel layer 906, a 2 nm thick undoped $Al_{0.2}Ga_{0.8}As$ spacer layer 907, a 9 nm thick $Al_{0.2}Ga_{0.8}As$ electron supply layer 908 doped with $4\times10^{18}$ cm$^{-3}$ of Si, a 10 nm thick $Al_{0.2}Ga_{0.8}As$ gate contact layer 909 doped with $5\times10^{17}$ cm$^{-3}$ of Si, a 15 nm thick undoped GaAs gate buried layer 910, a 6 nm thick GaAs gate buried layer 911 doped with $1\times10^{18}$ cm$^{-3}$ of Si, a 9 nm thick GaAs gate buried layer 912 doped with $5\times10^{16}$ cm$^{-3}$ of Si, a 6 nm thick $Al_{0.2}Ga_{0.8}As$ wide-recess stopper layer 913 doped with $4\times10^{18}$ cm$^{-3}$ of Si, a 6 nm thick undoped GaAs layer 914 and a 100 nm thick GaAs cap layer 915 doped with $4\times10^{18}$ cm$^{-3}$ of Si by epitaxial growth. To produce such an epitaxial wafer, use may be made of the MBE scheme or the MOVPE scheme, as desired.

A mask formed with a wide recess pattern is formed on the above epitaxial wafer. Then, the GaAs layers 915 and 914 are selectively etched with the wide-recess stopper layer 913 serving as a stopper layer. To so etch the GaAs layers 815 and 814, there may be used dry etching using a mixture of chloride gas containing only chlorine as a halogen element and fluoride gas containing only fluorine, e.g., a $BCl_3$ and $SF_6$ mixture.

After the removal of the above mask, the GaAs layers 912, 911 and 910 are selectively etched via a new mask formed with a gate recess pattern with the gate contact layer 909 serving as a stopper layer. As a result, the gate contact layer 909 is exposed to the outside. At this instant, the gate buried layers 912, 911 and 910 are not overetched. A gate electrode 916 is formed on the exposed gate contact layer 909. This produces a structure in which no gaps are present at the sides of the gate electrode 916.

Subsequently, a source electrode 917 and a drain electrode 918 are formed by the evaporation lift-off and alloying (e.g. 400° C./1 min) of AuGe, serving as ohmic electrodes.

In the structure shown in FIG. 17, the high concentration doping of the GaAs layer 911 stops the extension of a depletion layer from the surface of the GaAs layer 912 in the GaAs layers 912, 911 and 910. This is successful to obstruct the rise of a conduction band at the surface side in the channel right below the exposed GaAs layer, so that a great amount of electrons can be stored in the above layer. Further, two-dimensional electron gas is formed in the GaAs layer 910. This, coupled with the fact that the GaAs layer 910 is undoped, reduces diffusion and therefore enhances mobility. A low resistance current path (P2, FIG. 17) is formed by the undoped GaAs layer 910 in addition to a current path (P1, FIG. 17) formed by the channel layer 906. Consequently, the sheet resistance is reduced in the portion where the GaAs gate buried layer 912 is exposed (S, FIG. 17).

Moreover, two-dimensional electron gas formed in the undoped GaAs layers 910 and 914 lowers the potential barrier and thereby increases the probability that electrons pass through the potential barrier of the $Al_{0.2}Ga_{0.8}As$ layer 913 and a potential barrier formed by the $Al_{0.2}Ga_{0.8}As$ layers 909, 908 and 907. Because electron mobility in the undoped GaAs layers 910 and 914 is high, the contact resistance from the cap layer 915 to the channel layer 906 is lowered. In addition, because the gate contact layer 909 is not exposed to the outside, the sheet resistance increase of this portion is suppressed.

With the structure of FIG. 17, an ON resistance as low as 1.1 Ω·mm was achieved. This ON resistance is lower than the ON resistance of conventional FETs by 0.5 Ω·mm.

10th Embodiment

Figure 18:
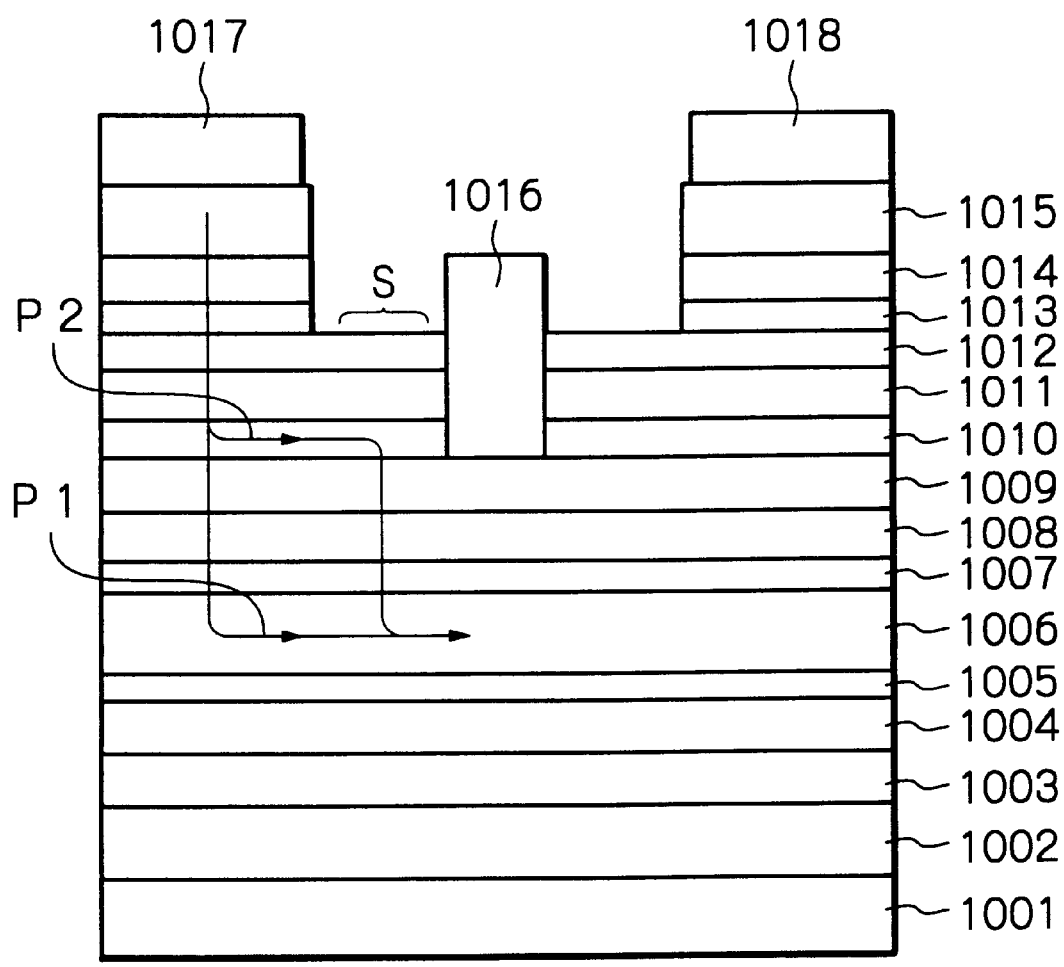
FIGS. 18–32 are sections respectively showing a tenth to a twenty-fourth embodiment of the present invention.

A tenth embodiment of the FET in accordance with the present invention is shown in FIG. 18 and includes a semi-insulating GaAs substrate 1001. As shown, there are sequentially formed on the substrate 1001 a 400 nm thick undoped GaAs buffer layer 1002, a 100 nm thick undoped $Al_{0.2}Ga_{0.8}As$ buffer layer 1003, a 4 nm thick $Al_{0.2}Ga_{0.8}As$ electron supply layer 1004 doped with $4\times10^{18}$ cm$^{-3}$ of Si, a 2 nm thick undoped $Al_{0.2}Ga_{0.8}As$ spacer layer 1005, a 15 nm thick undoped $In_{0.2}Ga_{0.8}As$ channel layer 1006, a 2 nm thick undoped $Al_{0.2}Ga_{0.8}As$ spacer layer 1007, a 9 nm thick $Al_{0.2}Ga_{0.8}As$ electron supply layer 1008 doped with $4\times10^{18}$ cm$^{-3}$ of Si, a 10 nm thick $Al_{0.2}Ga_{0.8}As$ gate contact layer 1009 doped with $5\times10^{17}$ cm$^{-3}$ of Si, a 15 nm thick undoped GaAs gate buried layer 1010, a 5 nm thick GaAs gate buried layer 1011 doped with $1\times10^{18}$ cm$^{-3}$ of Si, a 10 nm thick undoped GaAs gate buried layer 1012, a 6 nm thick $Al_{0.2}Ga_{0.8}As$ wide-recess stopper layer 1013 doped with $4\times10^{18}$ cm$^{-3}$ of Si, a 6 nm thick undoped GaAs layer 1014 and a 100 nm thick GaAs cap layer 1015 doped with $4\times10^{18}$ cm$^{-3}$ of Si by epitaxial growth. To produce such an epitaxial wafer, use may be made of the MBE scheme or the MOVPE scheme, as desired.

A mask formed with a wide recess pattern is formed on the above epitaxial wafer. Then, the GaAs layers 1015 and 1014 are selectively etched with the wide-recess stopper layer 1013 serving as a stopper layer. To so etch the GaAs layers 1015 and 104, there may be used dry etching using a mixture of chloride gas containing only chlorine as a halogen element and fluoride gas containing only fluorine, e.g., a $BCl_3$ and $SF_6$ mixture.

After the removal of the above mask, the GaAs layers 1012, 1011 and 1010 are selectively etched via a new mask formed with a gate recess pattern with the gate contact layer 1009 serving as a stopper layer. As a result, the gate contact layer 1009 is exposed to the outside. At this instant, the gate buried layers 1012, 1011 and 1010 are not overetched. A gate electrode 1016 is formed on the exposed gate contact layer 1009. This produces a structure in which no gaps are present at the sides of the gate electrode 1016.

Subsequently, a source electrode 1017 and a drain electrode 1018 are formed by the evaporation lift-off and alloying (e.g. 400° C./1 min) of AuGe, serving as ohmic electrodes.

In the structure shown in FIG. 18, the high concentration doping of the GaAs layer 1011 stops the extension of a depletion layer from the surface of the GaAs layer 1012 in the GaAs layers 1012, 1011 and 1010. This is successful to obstruct the rise of a conduction band at the surface side in the channel right below the exposed GaAs layer 1012, so that a great amount of electrons can be stored in the above layer. Further, two-dimensional electron gas is formed in the GaAs layer 1010. This, coupled with the fact that the GaAs layer 1010 is undoped, reduces diffusion and therefore enhances mobility. A low resistance current path (P2, FIG. 18) is formed by the undoped GaAs layer 1010 in addition to a current path (P1, FIG. 18) formed by the channel layer 1006. Consequently the sheet resistance is reduced in the portion where the GaAs gate buried layer 1012 is exposed (S, FIG. 18).

Moreover, two-dimensional electron gas formed in the undoped GaAs layers 1010, 1012 and 1014 lowers the potential barrier and thereby increases the probability that electrons pass through the potential barrier of the $Al_{0.2}Ga_{0.8}As$ layer 1013 and a potential barrier formed by the $Al_{0.2}Ga_{0.8}As$ layers 1009, 1008 and 1007. Because electron mobility in the undoped GaAs layers 1010, 1012 and 1014 is high, the contact resistance from the cap layer 1015 to the channel layer 1006 is lowered. In addition, because the gate contact layer 1009 is not exposed to the outside, the sheet resistance increase of this portion is suppressed.

With the structure of FIG. 18, an ON resistance as low as 1.0 Ω·mm was achieved. This ON resistance is lower than the ON resistance of conventional FETs by 0.6 Ω·mm.

11th Embodiment

Figure 19:
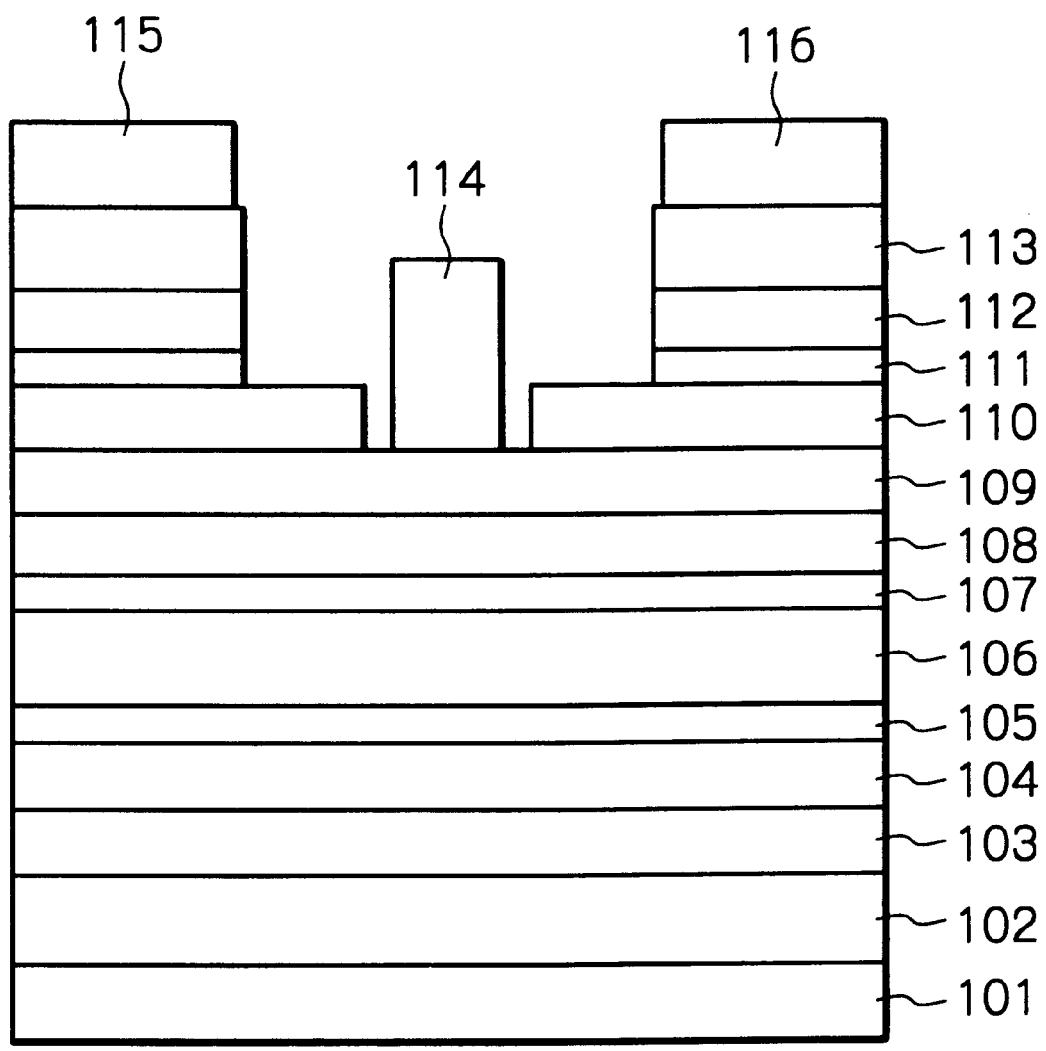

FIG. 19 shows an eleventh embodiment of the FET in accordance with the present invention. This embodiment uses the epitaxial wafer produced in the first embodiment. As shown, after a mask formed with a wide recess pattern has been formed on the epitaxial wafer, the GaAs layers 113 and 112 are selectively etched with the wide-recess stopper layer 111 serving as a stop layer. To so etch the two layers 113 and 112, there may be used dry etching using the ECR etching system or the RIE system and a mixture of chloride gas containing only chlorine as a halogen element and fluoride gas containing only fluorine, e.g., a $BCl_3$ and $SF_6$ mixture.

After the removal of the above mask, the GaAs gate buried layer 110 is selectively etched via a new mask formed with a gate recess pattern with the gate contact layer 109 serving as a stopper layer. As a result, the undoped gate contact layer 109 is exposed to the outside. At this instant, the buried layer 110 is overetched in order to cause etching to proceed in the horizontal direction of the gate buried layer 110. When the gate electrode 114 is formed on the exposed gate contact layer 109, gaps are formed at the sides of the gate electrode 114. For example, when 100% overetching was effected by using a $BCl_3$ and $SF_6$ gas mixture, gaps of about 20 nm were formed at the sides of the gate electrode 114. Such gaps should preferably be about 10 nm to about 50 nm.

Subsequently, the source electrode 115 and drain electrode 116 are formed by the evaporation lift-off and alloying (e.g. 400° C./1 min) of AuGe, serving as ohmic electrodes.

In the structure shown in FIG. 19, two-dimensional electron gas formed in the undoped GaAs layer 112 lowers the potential barrier and thereby increases the probability that electrons pass through the potential barrier of the stopper layer 111. In addition, because no impurities are doped in the GaAs layer 112, the scattering by ionized impurities is suppressed and electron mobility is high in the layer. Consequently, the contact resistance from the cap layer 113 to the channel layer 106 is successfully reduced. With the structure of FIG. 19, an ON resistance as low as 1.5 Ω·mm was achieved. This ON resistance is lower than the ON resistance of conventional FETs by 0.1 Ω·mm. Also, a gate breakdown voltage of 15 V was achieved because of the gaps formed at the sides of the gate electrode 114.

12th Embodiment

Figure 20:
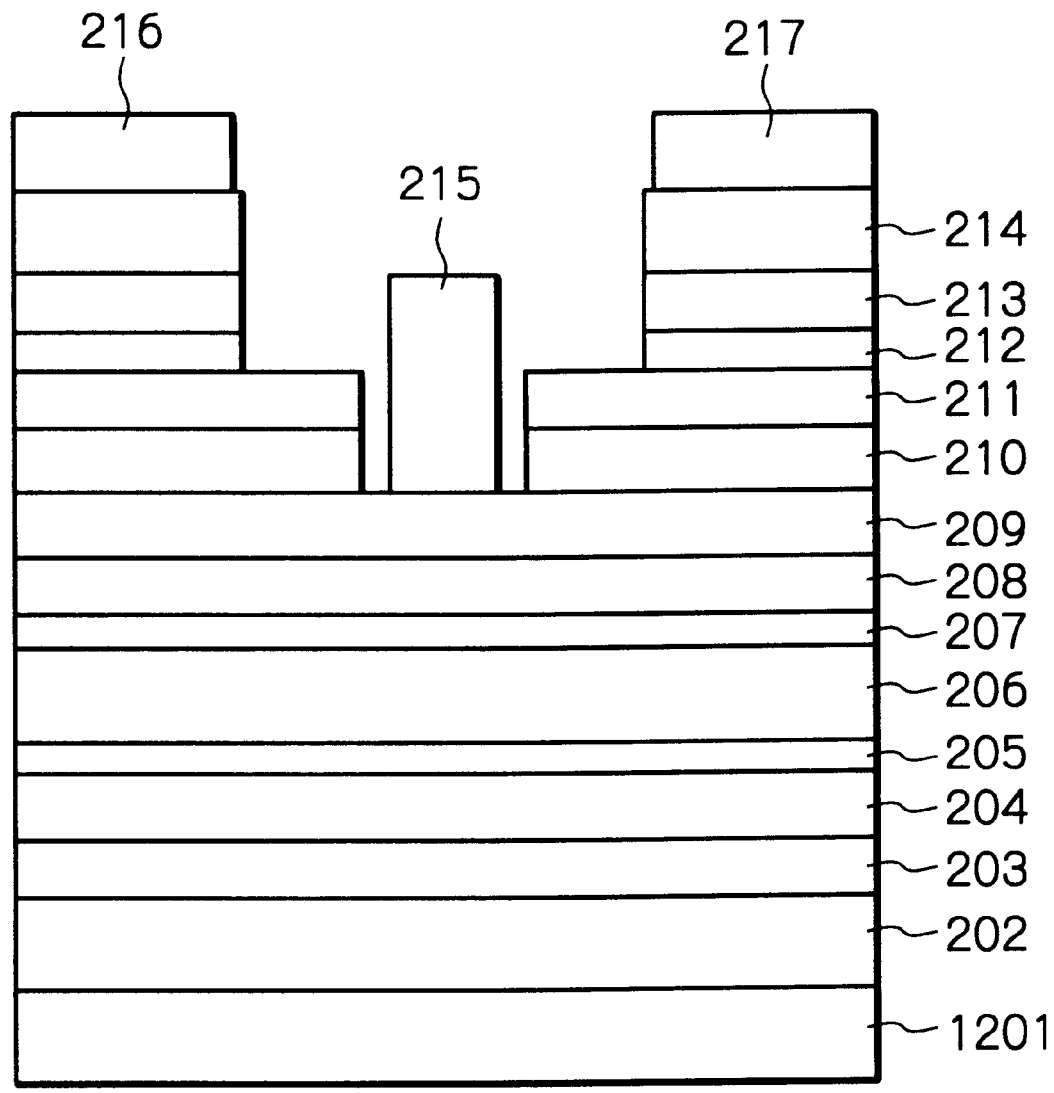

FIG. 20 shows a twelfth embodiment of the FET in accordance with the present invention. This embodiment executes the process of the eleventh embodiment by using the epitaxial layer of the second embodiment. As shown, gaps are formed at the sides of the gate electrode 215.

In the structure shown in FIG. 20, two-dimensional electron gas formed in the undoped GaAs layers 213 and 211 lowers the potential barrier and thereby increases the probability that electrons pass through the potential barrier of the stopper layer 212. In addition, because no impurities are doped in the GaAs layer 213 or 211, the scattering by ionized impurities is suppressed and electron mobility is high in the layers 213 and 211. Consequently, the contact resistance from the cap layer 214 to the channel layer 206 is successfully reduced. With the structure of FIG. 20, an ON resistance as low as 1.2 Ω·mm was achieved. This ON resistance is lower than the ON resistance of conventional FETs by 0.2 Ω·mm. Also, a gate breakdown voltage of 15 V was achieved because of the gaps formed at the sides of the gate electrode 215.

13th Embodiment

Figure 21:
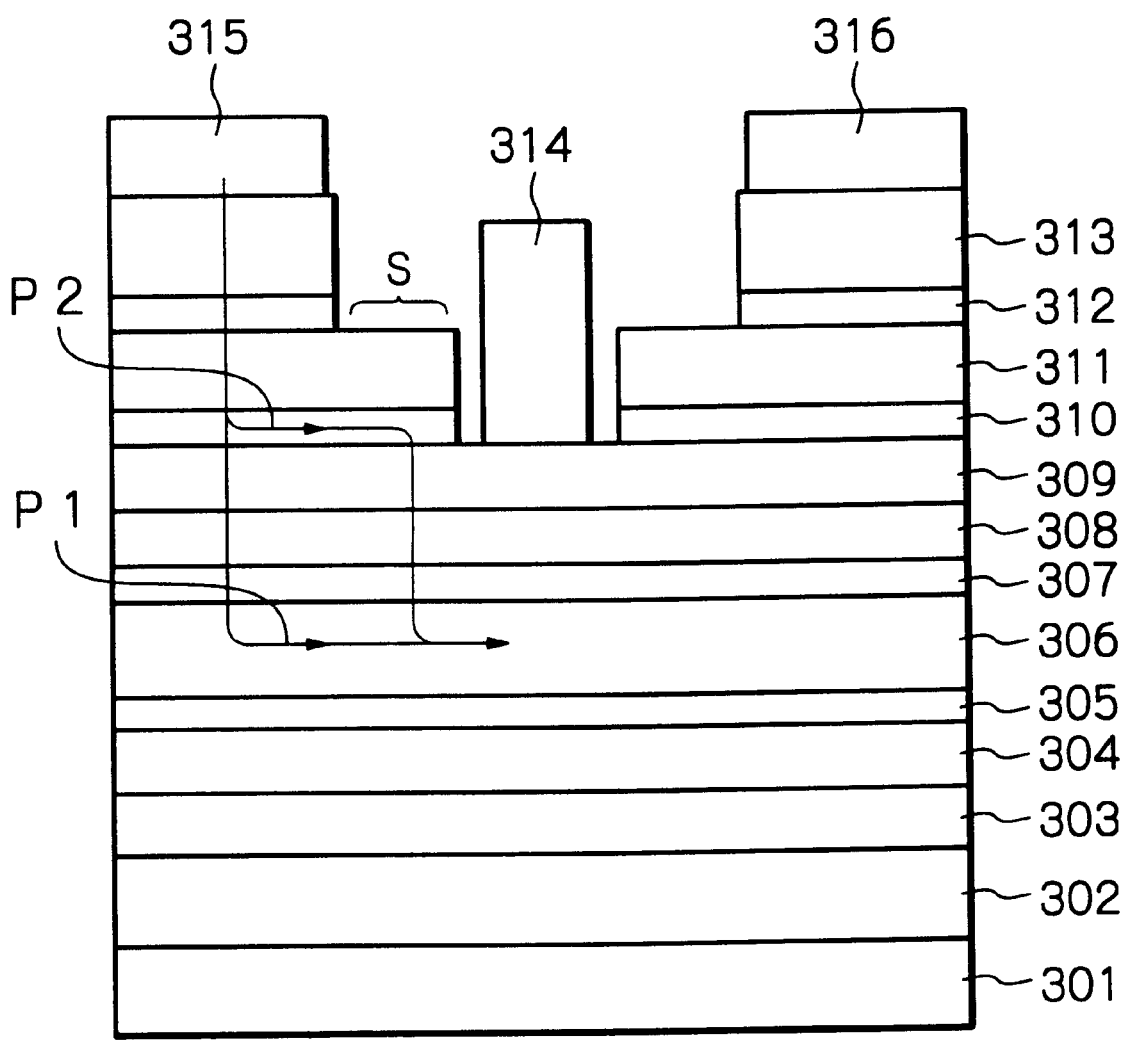

FIG. 21 shows a thirteenth embodiment of the FET in accordance with the present invention. This embodiment executes the process of the eleventh embodiment by using the epitaxial wafer of the third embodiment. As shown, gaps are formed at the sides of the gate electrodes 314.

In the structure shown in FIG. 21, two-dimensional electron gas formed in the undoped GaAs layer 310 lowers the potential barrier and thereby increases the probability that electrons pass through the potential barrier formed by the $Al_{0.2}Ga_{0.8}As$ layers 309, 308 and 307. In addition, because no impurities are doped in the GaAs layer 313, the scattering by ionized impurities is suppressed and electron mobility is high in the layer. Consequently, the contact resistance from the cap layer 313 to the channel layer 306 is successfully reduced. Further, two-dimensional electron gas formed in the undoped GaAs layer 310 having high electron mobility forms a low resistance current path (P2, FIG. 21) in addition to a current path (P1, FIG. 21) formed in the channel layer 306. The current path P2 serves to reduce the sheet resistance of the portion (S, FIG. 21) where the GaAs gate buried layer is exposed to the outside.

With the structure of FIG. 21, an ON resistance as low as 1.4 Ω·mm was achieved. This ON resistance is lower than the ON resistance of conventional FETs by 0.2 Ω·mm. Also, a gate breakdown voltage of 15 V was achieved because of the gaps formed at the sides of the gate electrode 314.

14th Embodiment

Figure 22:
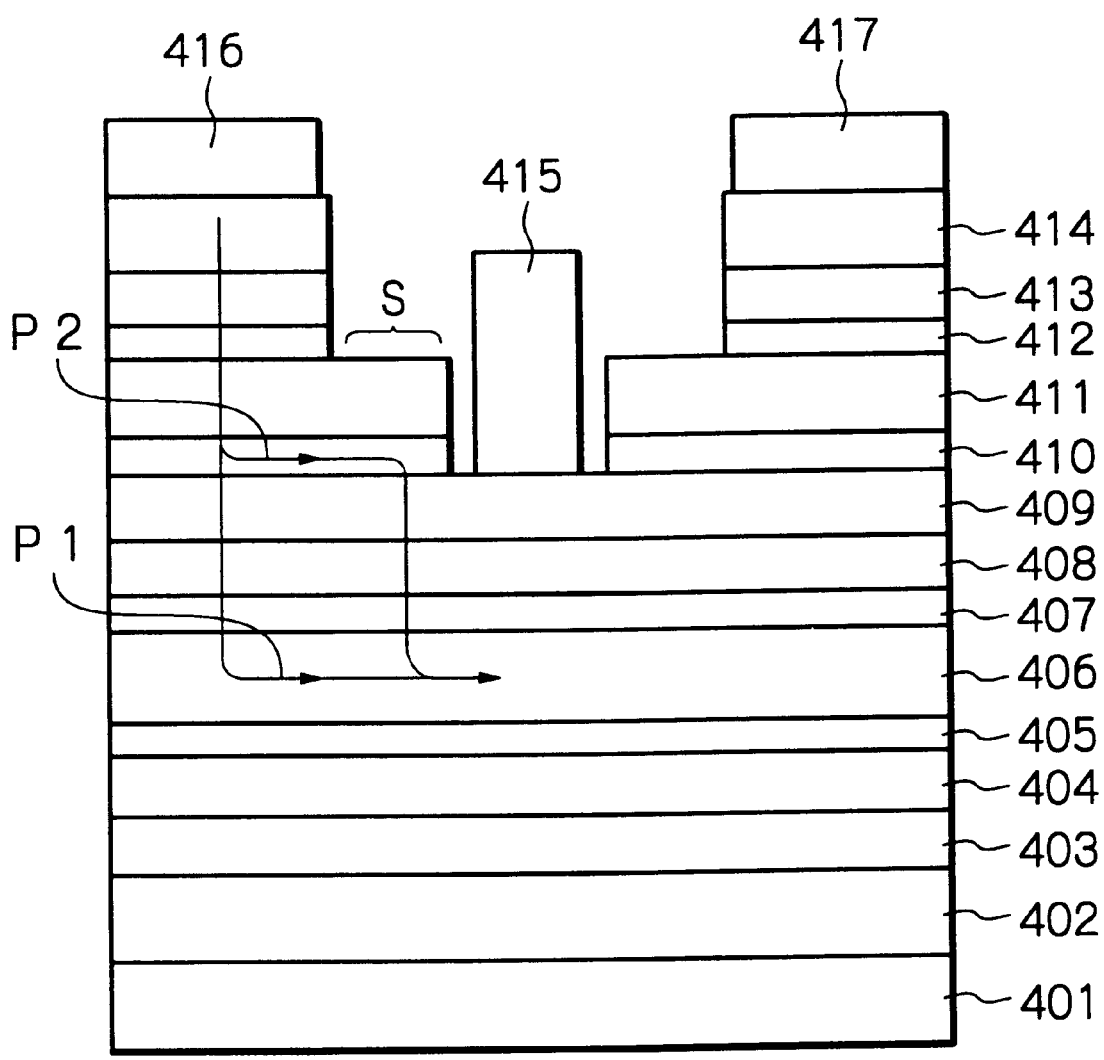

FIG. 22 shows a fourteenth embodiment of the FET in accordance with the present invention. This embodiment executes the process of FIG. 11 by using the epitaxial wafer of the fourth embodiment. As shown, gaps are formed at the sides of the gate electrode 415.

In the structure shown in FIG. 22, two-dimensional electron gas formed in the undoped GaAs layers 410 and 413 lowers the potential barrier and thereby increases the probability that electrons pass through the potential barrier of the $Al_{0.2}Ga_{0.8}As$ layer 412 and a potential barrier formed by the $Al_{0.2}Ga_{0.8}As$ layers 409, 408 and 407. In addition, because no impurities are doped in the GaAs layer 410 or 413, the scattering by ionized impurities is suppressed and electron mobility is high in the layers 410 and 413. Consequently, the contact resistance from the cap layer 414 to the channel layer 406 is successfully reduced. Further, two-dimensional electron gas formed in the undoped GaAs layer 410 having great electron mobility forms a low resistance current path (P2, FIG. 22) in addition to a current path (P1, FIG. 22) formed in the channel layer 406. The current path P2 serves to reduce the sheet resistance of the portion (S, FIG. 22) where the GaAs gate buried layer is exposed to the outside.

With the structure of FIG. 22, an ON resistance as low as 1.3 Ω·mm was achieved. This ON resistance is lower than the ON resistance of conventional FETs by 0.3 Ω·mm. Also, a gate breakdown voltage of 15 V was achieved because of the gaps formed at the sides of the gate electrode 415.

15th Embodiment

Figure 23:
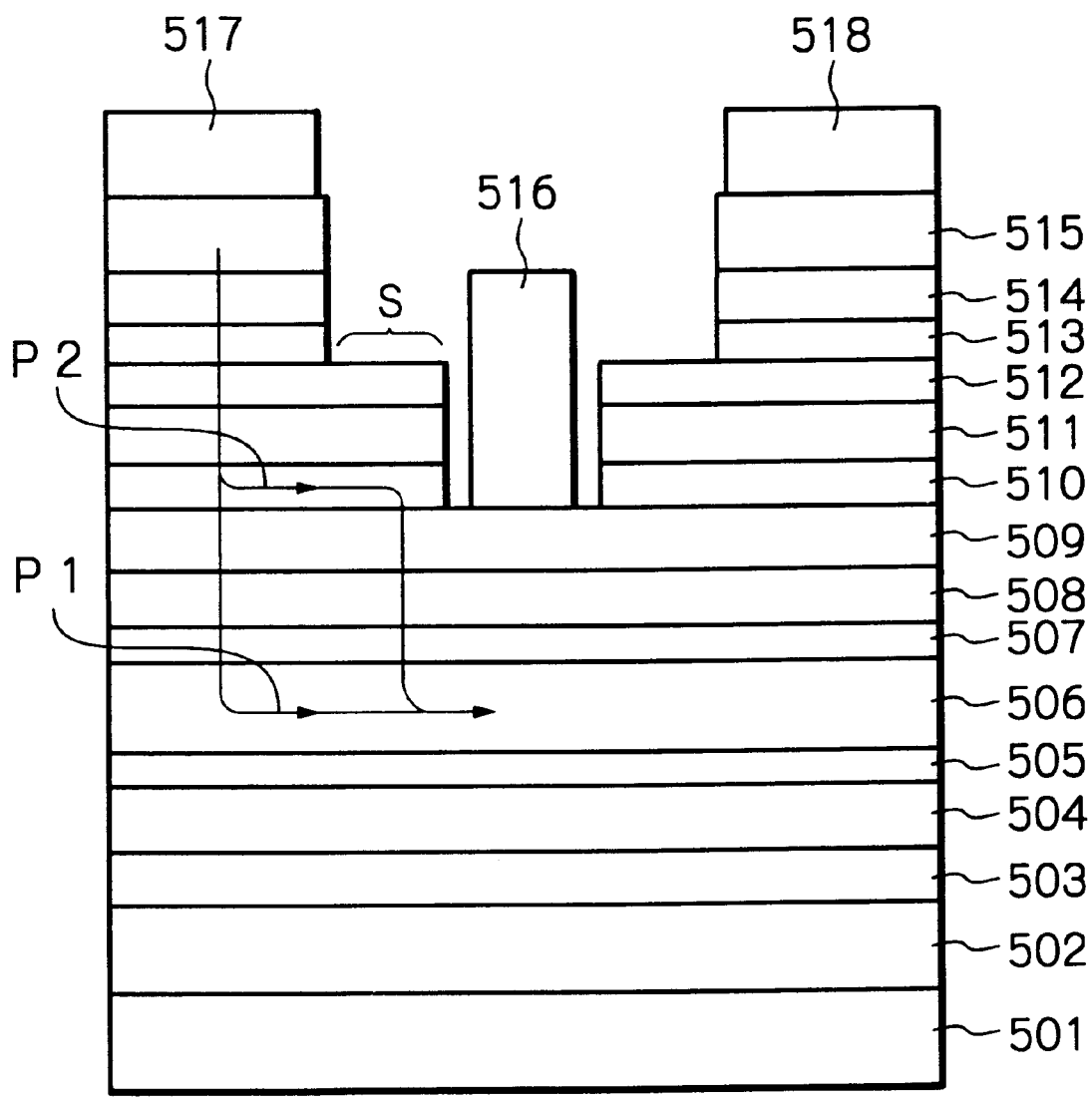

FIG. 23 shows a fifteenth embodiment of the FET in accordance with the present invention. This embodiment executes the process of the eleventh embodiment by using the epitaxial wafer of the fifth embodiment. As shown, gaps are formed at the sides of the gate electrodes 516.

In the structure shown in FIG. 23, two-dimensional electron gas formed in the undoped GaAs layers 510, 512 and 514 lowers the potential barrier and thereby increases the probability that electrons pass through the potential barrier of the $Al_{0.2}Ga_{0.8}As$ layer 513 and a potential barrier formed by the $Al_{0.2}Ga_{0.8}As$ layers 509, 508 and 507. In addition, because no impurities are doped in the GaAs layer 510, 512 or 514, the scattering by ionized impurities is suppressed and electron mobility is high in the layers 510, 512 and 514. Consequently, the contact resistance from the cap layer 515 to the channel layer 506 is successfully reduced. Further, two-dimensional electron gas formed in the undoped GaAs layer 510 having high electron mobility forms a low resistance current path (P2, FIG. 23) in addition to a current path (P1, FIG. 23) formed in the channel layer 506. The current path P2 serves to reduce the sheet resistance of the portion (S, FIG. 23) where the GaAs gate buried layer is exposed to the outside.

With the structure of FIG. 23, an ON resistance as low as 1.2 Ω·mm was achieved. This ON resistance is lower than the ON resistance of conventional FETs by 0.4 Ω·mm. Also, a gate breakdown voltage of 15 V was achievable because of the gaps formed at the sides of the gate electrode 516.

16th Embodiment

Figure 24:
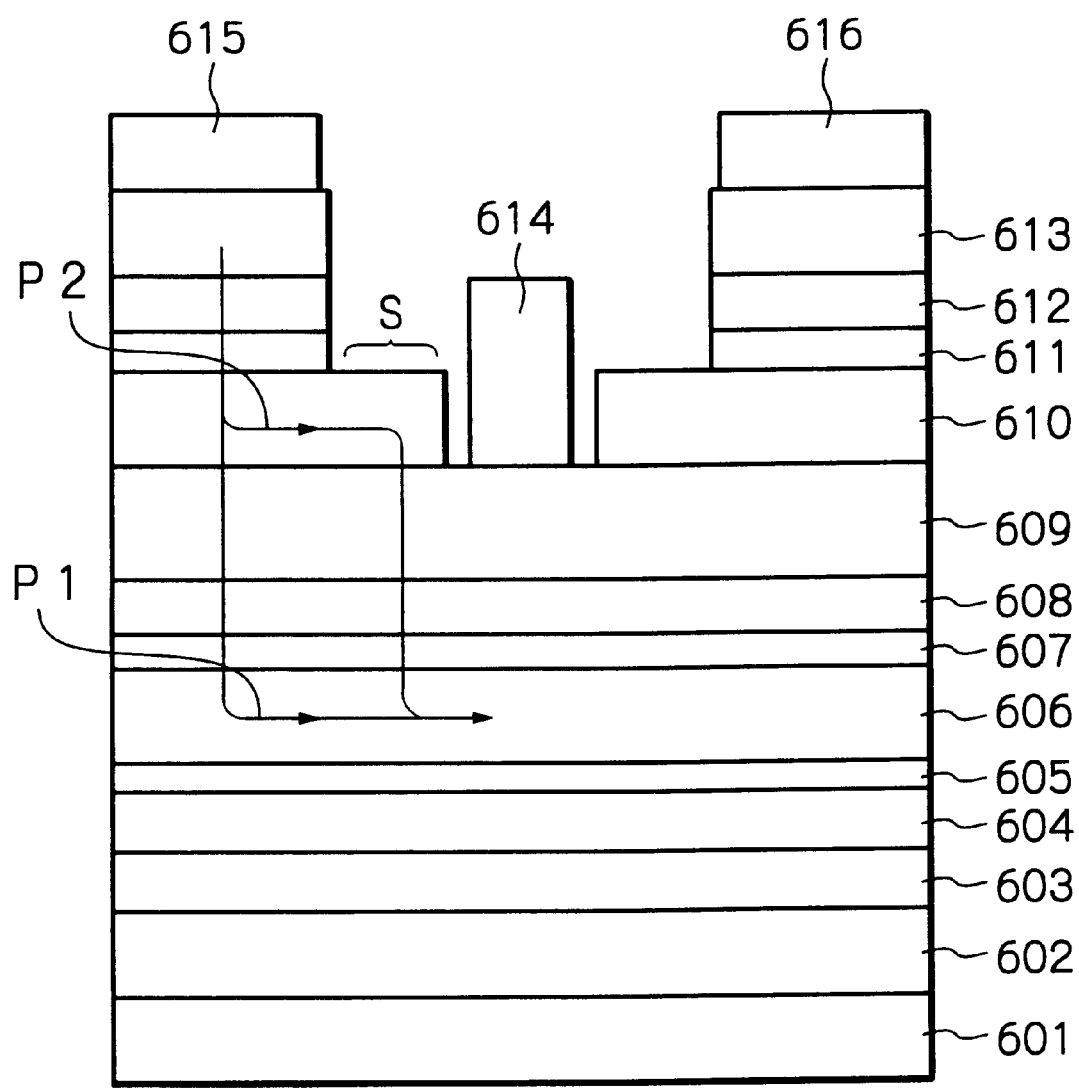

FIG. 24 shows a sixteenth embodiment of the FET in accordance with the present invention. This embodiment executes the process of FIG. 11 by using the epitaxial wafer of the sixth embodiment. As shown, gaps are formed at the sides of the gate electrode 614. In the structure shown in FIG. 24, two-dimensional electron gas formed in the undoped GaAs layers 610 and 612 lowers the potential barrier and thereby increases the probability that electrons pass through the potential barrier of the $Al_{0.2}Ga_{0.8}As$ layer 611 and a potential barrier formed by the $Al_{0.2}Ga_{0.8}As$ layers 609, 608 and 607. In addition, because no impurities are doped in the GaAs layer 612 or 610, the scattering by ionized impurities is suppressed and electron mobility is high in the layers 612 and 610. Consequently, the contact resistance from the cap layer 614 to the channel layer 606 is successfully reduced. Further, two-dimensional electron gas formed in the undoped GaAs layer 610 having high electron mobility forms a low resistance current path (P2, FIG. 24) in addition to a current path (P1, FIG. 24) formed in the channel layer 606. The current path P2 serves to reduce the sheet resistance of the portion (S, FIG. 24) where the GaAs gate buried layer is exposed to the outside.

With the structure of FIG. 24, an ON resistance as low as 1.2 Ω·mm was achieved. This ON resistance is lower than the ON resistance of conventional FETs by 0.4 Ω·mm. Also, a gate breakdown voltage of 15 V was achieved because of the gaps formed at the sides of the gate electrode 614.

17th Embodiment

Figure 25:
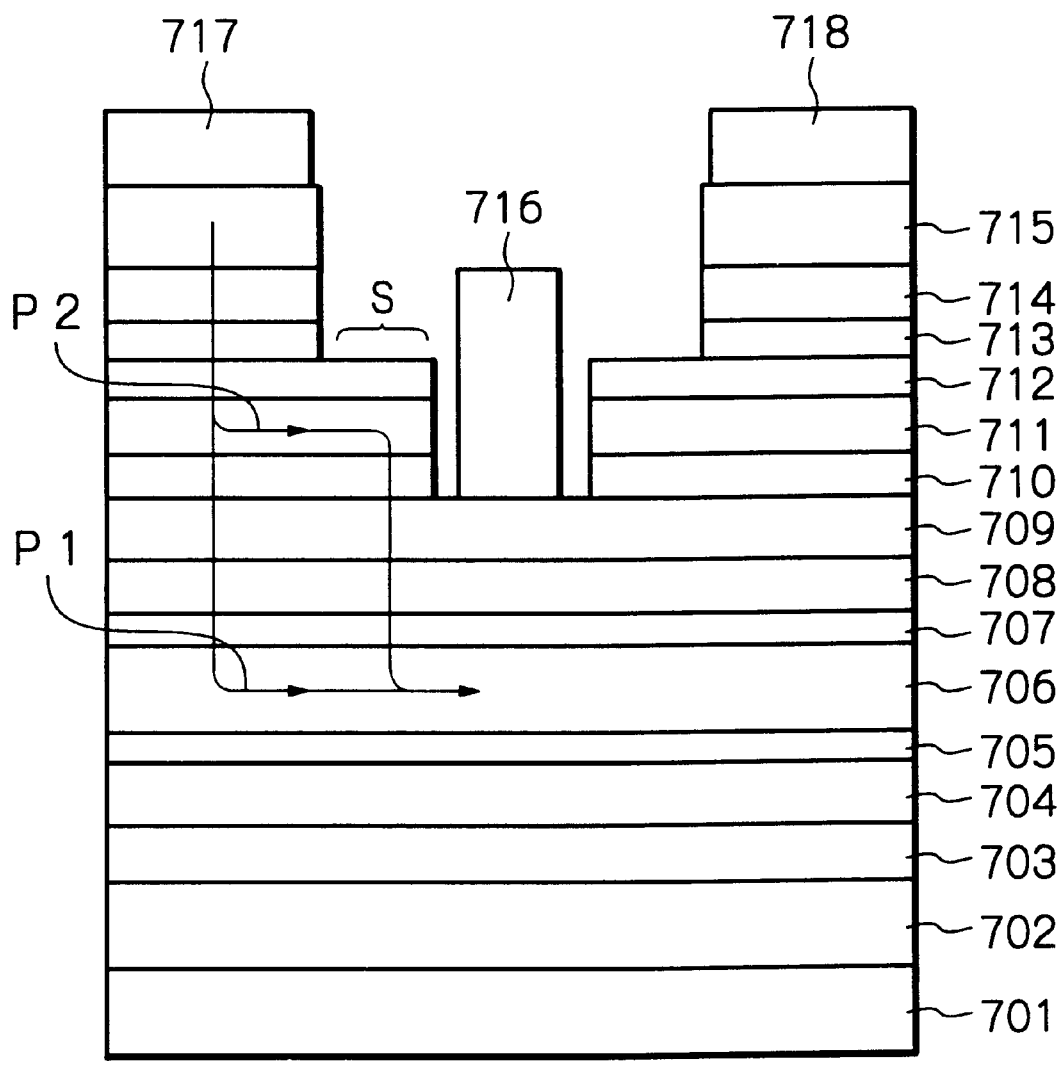

FIG. 25 shows a seventeenth embodiment of the FET in accordance with the present invention. This embodiment executes the procedure of the eleventh embodiment by using the epitaxial layer of the seventh embodiment. As shown, gaps are formed at the sides of the gate electrode 716.

In the structure shown in FIG. 25, a depletion layer tending to extend from the surface of the GaAs layer 712 toward the channel side stops in the GaAs layers 712, 711 and 710. This is successful to obstruct the rise of a conduction band at the surface side in the channel, so that a great amount of electrons can be stored in the above layer. Further, a current path is formed not only in the channel (P1, FIG. 25) but also in the gate buried layer (P2, FIG. 25), so that the sheet resistance is reduced in the exposed portion of the GaAs gate buried layer (S, FIG. 25). Moreover, two-dimensional electron gas formed in the undoped GaAs layer 714 lowers the potential barrier of the $Al_{0.2}Ga_{0.8}As$ layer 713 and thereby increases the probability that electrons pass through the potential barrier of the $Al_{0.2}Ga_{0.8}As$ layer 713. In addition, because no impurities are doped in the GaAs layer 714, the scattering by ionized impurities is suppressed and electron mobility is high in the layer 714. Consequently, the contact resistance from the cap layer 715 to the channel layer 706 is successfully reduced.

With the structure of FIG. 25, an ON resistance as low as 1.3 Ω·mm was achieved. This ON resistance is lower than the ON resistance of conventional FETs by 0.3 Ω·mm. Also, a gate breakdown voltage of 15 V was achievable because of the gaps formed at the sides of the gate electrode 716.

18th Embodiment

Figure 26:
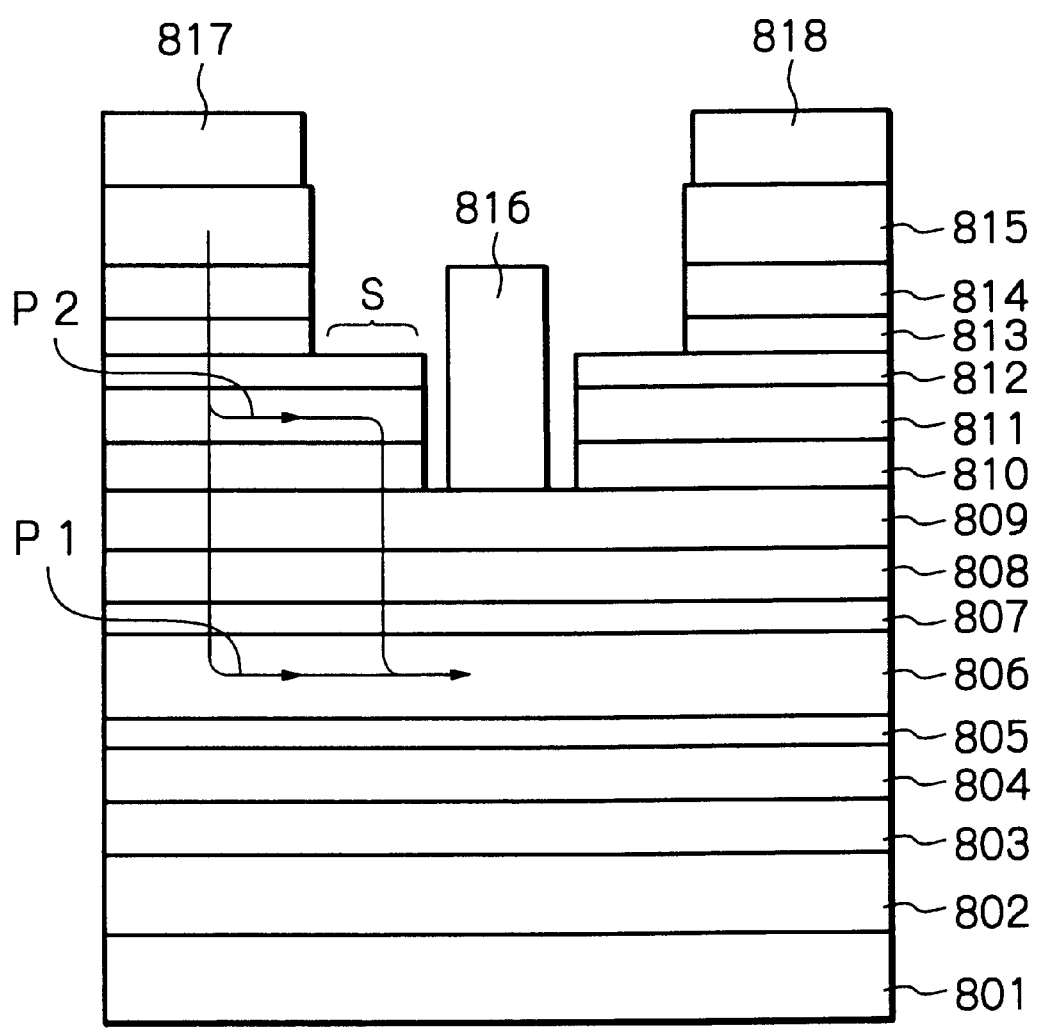

FIG. 26 shows an eighteenth embodiment of the FET in accordance with the present invention. This embodiment executes the process of eleventh embodiment by using the epitaxial layer of the eighth embodiment. As shown, gaps are formed at the sides of the gate electrode 816.

In the structure shown in FIG. 26, the high concentration doping of the GaAs layer 811 stops the extension of a depletion layer from the surface of the GaAs layer 812 toward the channel side in the GaAs layers 812, 811 and 810. This is successful to obstruct the rise of a conduction band at the surface side in the channel right below the exposed GaAs layer, so that a great amount of electrons can be stored in the above layer. Further, a current path is formed not only in the channel (P1, FIG. 26) but also in the gate buried layer (P2, FIG. 26), so that the sheet resistance is reduced in the exposed portion of the GaAs gate buried layer (S, FIG. 26).

Moreover, two-dimensional electron gas formed in the undoped GaAs layers 812 and 814 lowers the potential barrier and thereby increases the probability that electrons pass through the potential barrier of the $Al_{0.2}Ga_{0.8}As$ layer 813. In addition, because no impurities are doped in the GaAs layer 812 or 814, the scattering by ionized impurities is suppressed and electron mobility is high in the layers 812 and 814. Consequently, the contact resistance from the cap layer 815 to the channel layer 806 is successfully reduced.

With the structure of FIG. 26, an ON resistance as low as 1.2 Ω·mm was achieved. This ON resistance is lower than the ON resistance of conventional FETs by 0.4 Ω·mm. Also, a gate breakdown voltage of 15 V was achievable because of the gaps formed at the sides of the gate electrode 816.

19th Embodiment

Figure 27:
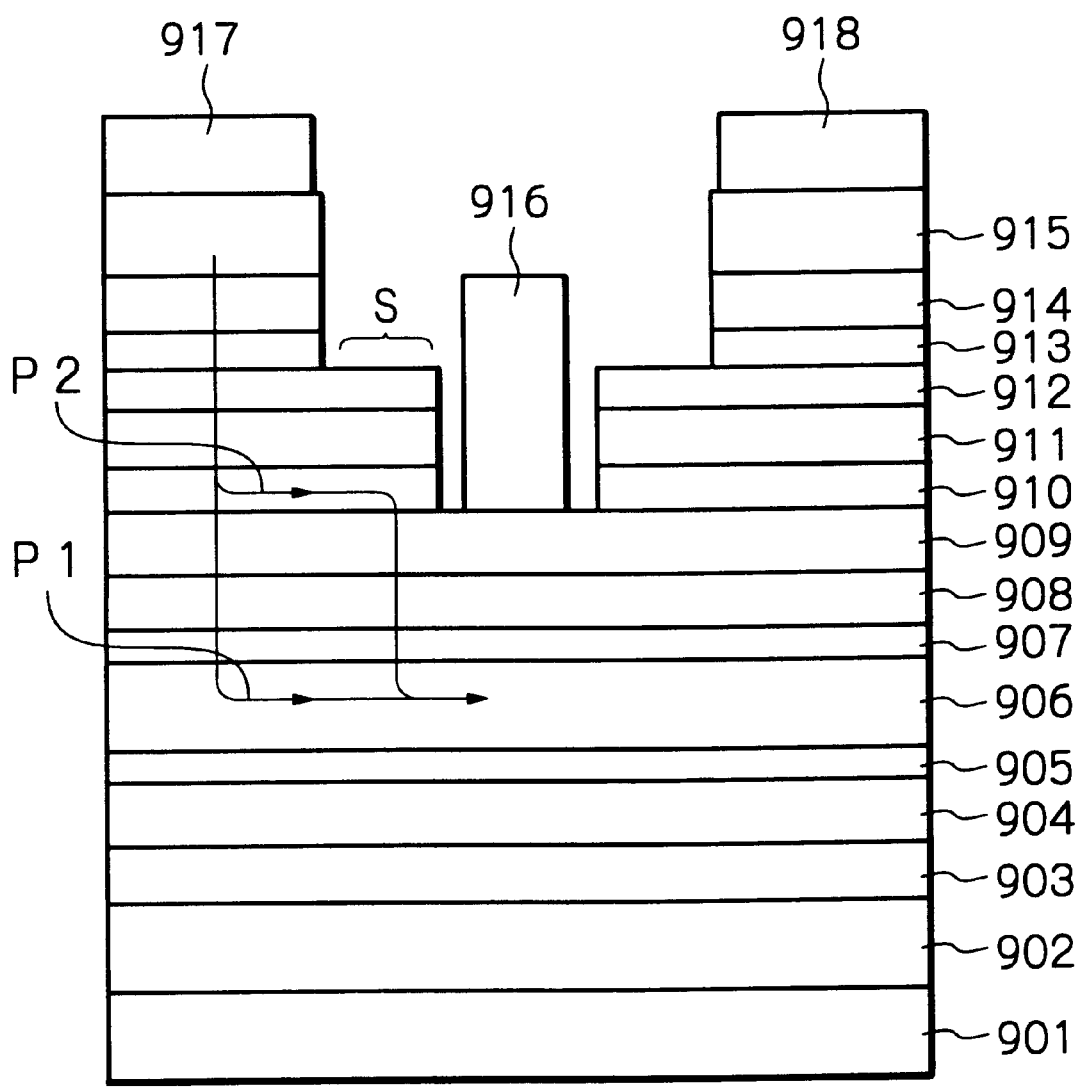

FIG. 27 shows a nineteenth embodiment of the FET in accordance with the present invention. This embodiment executes the procedure of the eleventh embodiment by using the epitaxial wafer of the ninth embodiment. As shown, gaps are formed at the sides of the gate electrode 916.

In the structure shown in FIG. 27, the high concentration doping of the GaAs layer 911 stops the extension of a depletion layer from the surface of the GaAs layer 912 toward the channel side in the GaAs layers 912, 911 and 910. This is successful to obstruct the rise of a conduction band at the surface side in the channel right below the exposed GaAs layer, so that a great amount of electrons can be stored in the above layer. Further, two-dimensional electron gas is formed in the GaAs layer 910. This, coupled with the fact that the GaAs layer 910 is undoped, reduces diffusion and therefore enhances mobility. A low resistance current path (P2, FIG. 27) is formed by the undoped GaAs layer 910 in addition to a current path (P1, FIG. 27) formed by the channel layer 906. Consequently, the sheet resistance is reduced in the portion where the GaAs gate buried layer 912 is exposed (S, FIG. 27).

Moreover, two-dimensional electron gas formed in the undoped GaAs layers 910 and 914 lowers the potential barrier and thereby increases the probability that electrons pass through the potential barrier of the $Al_{0.2}Ga_{0.8}As$ layer 913 and a potential barrier formed by the $Al_{0.2}Ga_{0.8}As$ layers 909, 908 and 907. Because electron mobility in the undoped GaAs layers 910 and 914 is high, the contact resistance from the cap layer 915 to the channel layer 906 is lowered.

With the structure of FIG. 27, an ON resistance as low as 1.2 Ω·mm was achieved. This ON resistance is lower than the ON resistance of conventional FETs by 0.4 Ω·mm. Also, a gate breakdown voltage of 15 V was achieved because of the gaps formed at the sides of the gate electrode 916.

20th Embodiment

Figure 28:
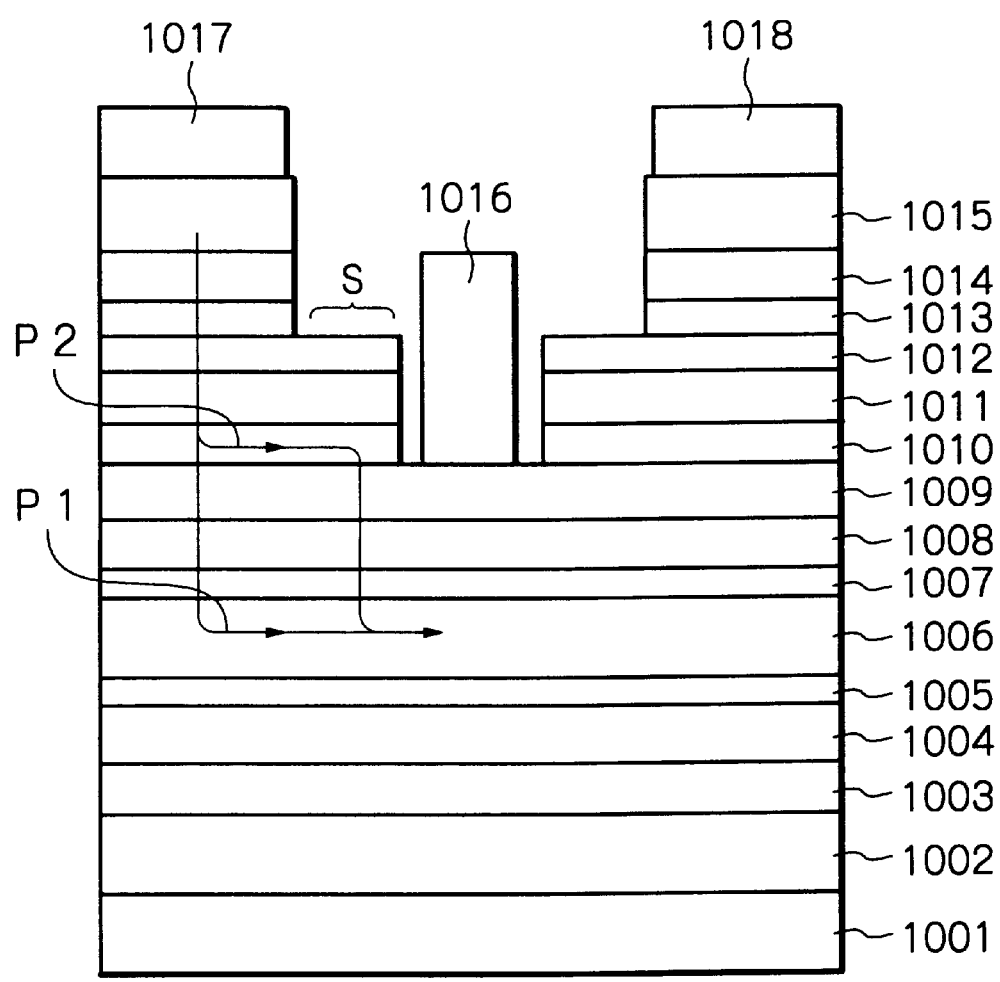

FIG. 28 shows a twentieth embodiment of the FET in accordance with the present invention. This embodiment executes the process of the eleventh embodiment by using the epitaxial wafer of the tenth embodiment. As shown, gaps are formed at the sides of the gate electrode 1016.

In the structure shown in FIG. 28, the high concentration doping of the GaAs layer 1011 stops the extension of a depletion layer from the surface of the GaAs layer 1012 toward the channel side in the GaAs layers 1012, 1011 and 1010. This is successful to obstruct the rise of a conduction band at the surface side in the channel right below the exposed GaAs layer 1012, so that a great amount of electrons can be stored in the above layer. Further, two-dimensional electron gas is formed in the GaAs layer 1010. This, coupled with the fact that the GaAs layer 1010 is undoped, reduces diffusion and therefore enhances mobility. A low resistance current path (P2, FIG. 28) is formed by the undoped GaAs layer 1010 in addition to a current path (P1, FIG. 28) formed by the channel layer 1006. Consequently, the sheet resistance is reduced in the portion where the GaAs gate buried layer 1012 is exposed (S, FIG. 28).

Moreover, two-dimensional electron gas formed in the undoped GaAs layers 1010, 1012 and 1014 lowers the potential barrier and thereby increases the probability that electrons pass through the potential barrier of the $Al_{0.2}Ga_{0.8}As$ layer 1013 and a potential barrier formed by the $Al_{0.2}Ga_{0.8}As$ layers 1009, 1008 and 1007. Because electron mobility in the undoped GaAs layers 1010, 1012 and 1014 is high, the contact resistance from the cap layer 1015 to the channel layer 1006 is lowered.

With the structure of FIG. 28, an ON resistance as low as 1.1 Ω·mm was achieved. This ON resistance is lower than the ON resistance of conventional FETs by 0.5 Ω·mm. Also, a gate breakdown voltage of 15 V was achieved because of the gaps formed at the sides of the gate electrode 1016.

21st Embodiment

Figure 29:
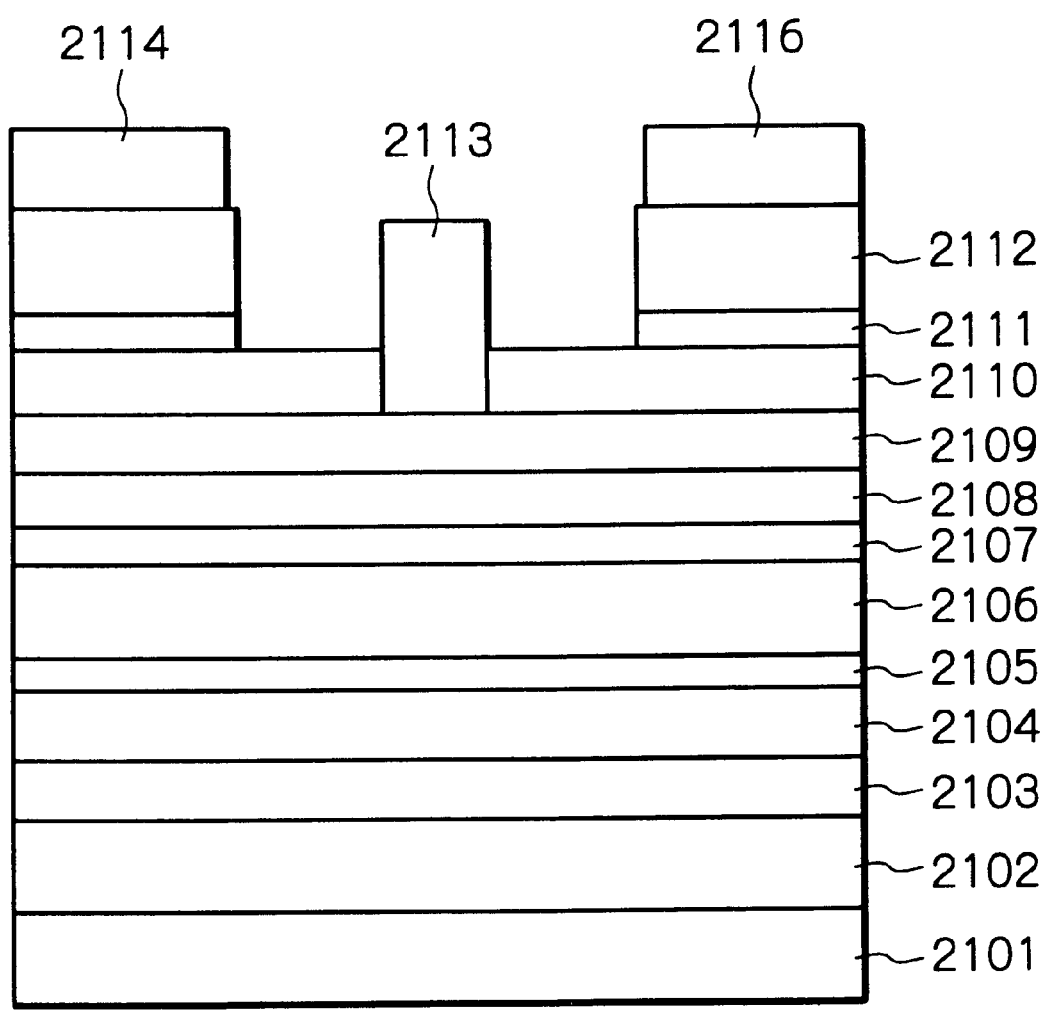

Referring to FIG. 29, a twenty-first embodiment of the FET in accordance with the present invention is shown and includes a semi-insulating GaAs substrate 2101. As shown, there are sequentially formed on the substrate 2101 a 400 nm thick undoped GaAs buffer layer 2102, a 100 nm thick undoped $Al_{0.2}Ga_{0.8}As$ buffer layer 2103, a 4 nm thick $Al_{0.2}Ga_{0.8}As$ electron supply layer 2104 doped with $4\times10^{18}$ $cm^{-3}$ of Si, a 2 nm thick undoped $Al_{0.2}Ga_{0.8}As$ spacer layer 2105, a 15 nm thick undoped $In_{0.2}Ga_{0.8}As$ channel layer 2106, a 2 nm thick undoped $Al_{0.2}Ga_{0.8}As$ spacer layer 2107, a 9 nm thick $Al_{0.2}Ga_{0.8}As$ electron supply layer 2108 doped with $4\times10^{18}$ $cm^{-3}$ of Si, a 10 nm thick $Al_{0.2}Ga_{0.8}As$ gate contact layer 2109 doped with $5\times10^{17}$ $cm^{-3}$ of Si, a 30 nm thick GaAs gate buried layer 2110 doped with $5\times10^{18}$ $cm^{-3}$ of Si, a 6 nm thick $Al_{0.2}Ga_{0.8}As$ wide-recess stopper layer 2111 doped with $4\times10^{18}$ $cm^{-3}$ of Si and a 100 nm thick GaAs cap layer 2112 doped with $4\times10^{18}$ $cm^{-3}$ of Si by epitaxial growth. To produce such an epitaxial wafer, use may be made of the MBE scheme or the MOVPE scheme, as desired.

After the above epitaxial wafer has been produced, a mask formed with a wide recess pattern is formed on the wafer. Then, the GaAs layer 2112 is selectively etched with the wide-recess stopper layer 2111 serving as a stop layer. To so etch the two layer 2112, there may be used dry etching using a mixture of chloride gas containing only chlorine as a halogen element and fluoride gas containing only fluorine, e.g., a $BCl_3$ and $SF_6$ mixture.

After the removal of the above mask, the GaAs gate buried layer 2110 is selectively etched via a new mask formed with a gate recess pattern with the gate contact layer 2109 serving as a stopper layer. As a result, the undoped gate contact layer 2109 is exposed to the outside. At this instant, the buried layer 2110 is not overetched. A gate electrode 2113 is formed on the exposed gate contact layer 2109. This produces a structure in which no gaps are present at the sides of the gate electrode 2113.

Subsequently, a source electrode 2114 and a drain electrode 2115 are formed by the evaporation lift-off and alloying (e.g. 400° C./1 min) of AuGe, serving as ohmic electrodes.

In the structure shown in FIG. 29, the high concentration n-type impurities doped in the gate contact layer 2109 and wide-recess stopper layer 2111 increase the amount of electrons stored around the interface between the gate buried layer 2110 and cap layer 2112 and the gate contact layer 2109. This successfully reduces contact resistance from the cap layer 2112 to the channel layer 2106. Further, because the gate contact layer 2109 is not exposed to the outside, the sheet resistance increase of this portion is suppressed.

With the structure of FIG. 29, an ON resistance as low as 1.3 Ω·mm was achieved. This ON resistance is lower than the ON resistance of conventional FETs by 0.3 Ω·mm.

22nd Embodiment

Figure 30:
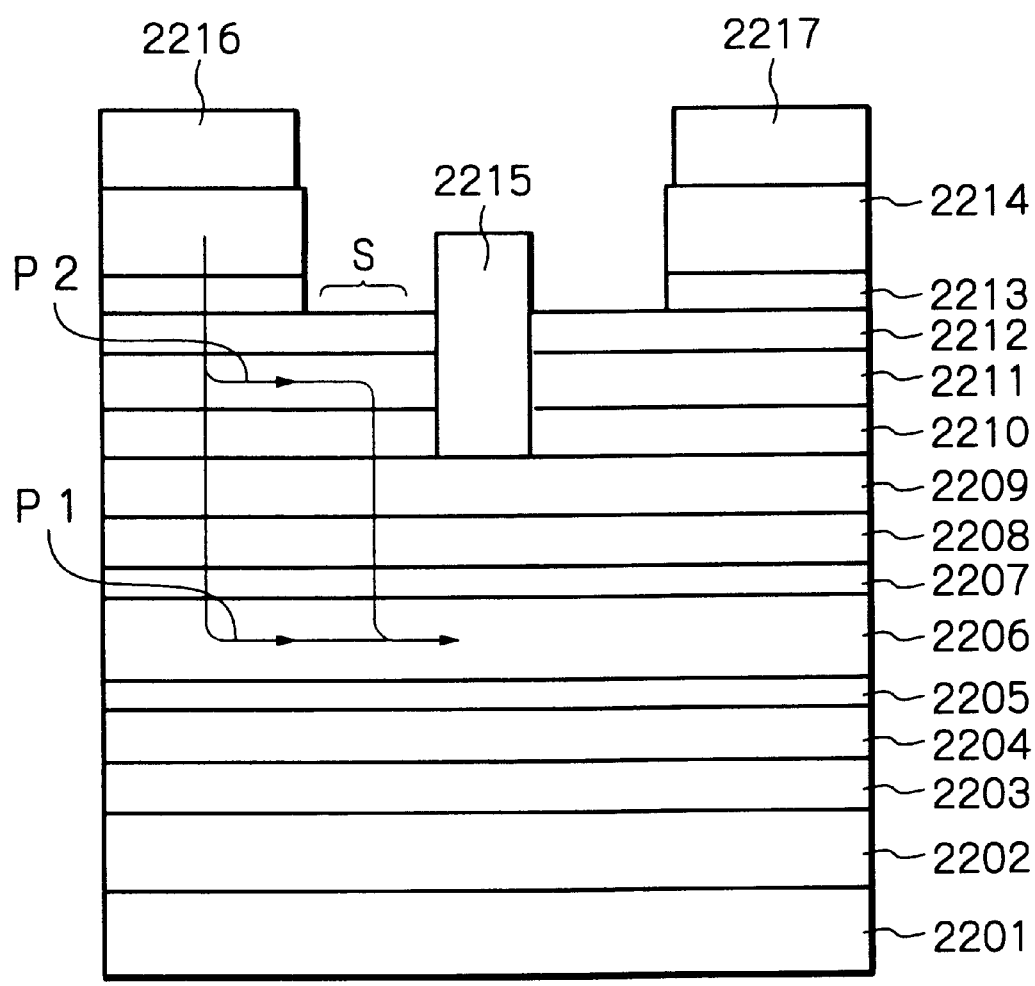

FIG. 30 shows a twenty-second embodiment of the FET in accordance with the present invention. As shown, there are formed on a semi-insulating GaAs substrate 2201 a 400 nm thick undoped GaAs buffer layer 2202, a 100 nm thick undoped $Al_{0.2}Ga_{0.8}As$ buffer layer 2203, a 4 nm thick $Al_{0.2}Ga_{0.8}As$ electron supply layer 2204 doped with $4\times10^{18}$ $cm^{-3}$ of Si, a 2 nm thick undoped $Al_{0.2}Ga_{0.8}As$ spacer layer 2205, a 15 nm thick undoped $In_{0.2}Ga_{0.8}As$ channel layer 2206, a 2 nm thick undoped $Al_{0.2}Ga_{0.8}As$ spacer layer 2207, a 9 nm thick $Al_{0.2}Ga_{0.8}As$ electron supply layer 2208 doped with $4\times10^{18}$ $cm^{-3}$ of Si, a 10 nm thick $Al_{0.2}Ga_{0.8}As$ gate contact layer 2209 doped with $5\times10^{17}$ $cm^{-3}$ of Si, a 20 nm thick GaAs gate buried layer 2210 doped with $5\times10^{16}$ $cm^{-3}$ of Si, a 6 nm thick GaAs gate buried layer 2211 doped with $1\times10^{18}$ $cm^{-3}$ of Si, a 4 nm thick GaAs gate buried layer 2212 doped with $5\times10^{16}$ $cm^{-3}$ of Si, a 6 nm thick $Al_{0.2}Ga_{0.8}As$ wide-recess stopper layer 2213 doped with $4\times10^{18}$ $cm^{-3}$ of Si and a 100 nm thick GaAs cap layer 2214 doped with $4\times10^{18}$ $cm^{-3}$ of Si by epitaxial growth. To produce such an epitaxial wafer, use may be made of the MBE scheme or the MOVPE scheme, as desired.

After the above epitaxial wafer has been produced, a mask formed with a wide recess pattern is formed on the wafer. Then, the GaAs layer 2214 is selectively etched with the wide-recess stopper layer 2213 serving as a stopper layer. To so etch the layer 2214, there may be used dry-etching using a mixture of chloride gas containing only chlorine as a halogen element and fluoride gas containing only fluorine, e.g., a $BCl_3$ and $SF_6$ mixture.

After the removal of the above mask, the GaAs gate buried layers 2210, 2211 and 2212 are selectively etched via a new mask formed with a gate recess pattern with the gate contact layer 2209 serving as a stopper layer. As a result, the undoped gate contact layer 2209 is exposed to the outside. At this instant, the gate buried layers 2210, 2211 and 2212 are not overetched. A gate electrode 2215 is formed on the exposed gate contact layer 2209. This produces a structure in which no gaps are present at the sides of the gate electrode 2215.

Subsequently, a source electrode 2216 and a drain electrode 2217 are formed by the evaporation lift-off and alloying (e.g. 400° C./1 min) of AuGe, serving as ohmic electrodes.

In the structure shown in FIG. 30, the high concentration n-type impurities doped in the gate contact layer 2209 and wide-recess stopper layer 2211 increase the amount of electrodes stored around the interface between the gate buried layer 2210 and cap layer 2214 and the gate contact layer 2209. This successfully reduces the contact resistance from the cap layer 2214 to the channel layer 2206. Further, the extension of a depletion layer from the surface of the GaAs layer 2212 toward the channel side is stopped in the GaAs layers 2212, 2211 and 2210. This is successful to obstruct the rise of a conduction band at the surface side in the channel and therefore to obviate exhaustion of electrons in the channel. Moreover, a current path is formed not only in the channel (P1, FIG. 30) but also in the gate buried layer (P2, FIG. 30), so that the sheet resistance is reduced in the exposed GaAs gate buried layer portion (S, FIG. 30). In addition, because the gate contact layer 2209 is not exposed, the sheet resistance increase of this portion is suppressed.

With the structure of FIG. 30, an ON resistance as low as 1.2 Ω·mm was achieved. This ON resistance is lower than the ON resistance of conventional FETs by 0.4 Ω·mm.

23rd Embodiment

Figure 31:
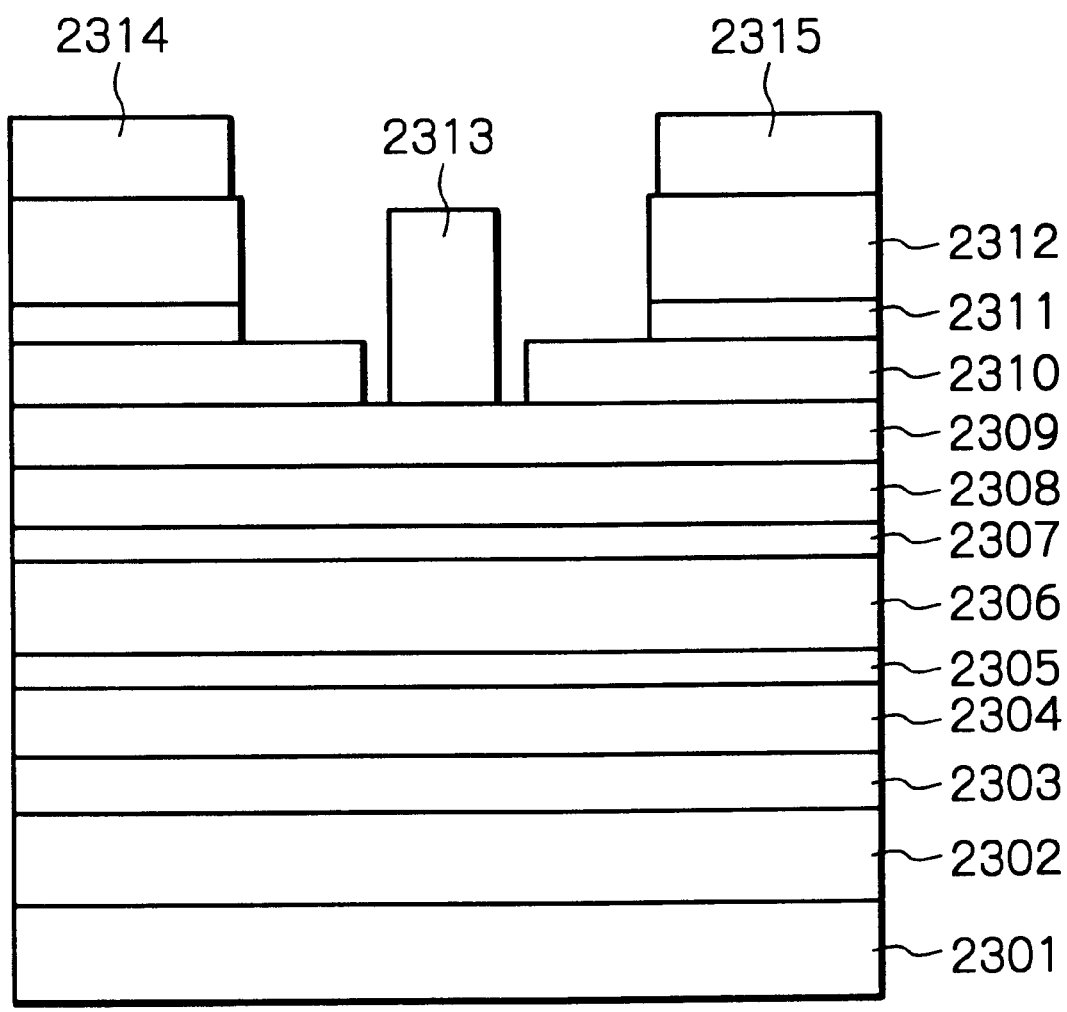

FIG. 31 shows a twenty-third embodiment of the FET in accordance with the present invention. This embodiment executes the process of the eleventh embodiment by using the epitaxial wafer of the twenty-first embodiment. As shown, gaps are formed at the sides of the gate electrode 2313.

In the structure shown in FIG. 31, the high concentration n-type impurities doped in the gate contact layer 2309 and wide-recess stopper layer 2311 increase the amount of electrodes stored around the interface between the gate buried layer 2310 and cap layer 2312 and the gate contact layer 2309. This successfully reduces the contact resistance from the cap layer 2312 to the channel layer 2306. Further, because the gate contact layer 2309 is not exposed to the outside, the sheet resistance in this portion sparingly increases.

With the structure of FIG. 30, an ON resistance as low as 1.4 Ω·mm was achieved. This ON resistance is lower than the ON resistance of conventional FETs by 0.2 Ω·mm. Also, a gate breakdown voltage of 15 V was achieved because of the gaps formed at the sides of the gate electrode 2313.

24th Embodiment

Figure 32:
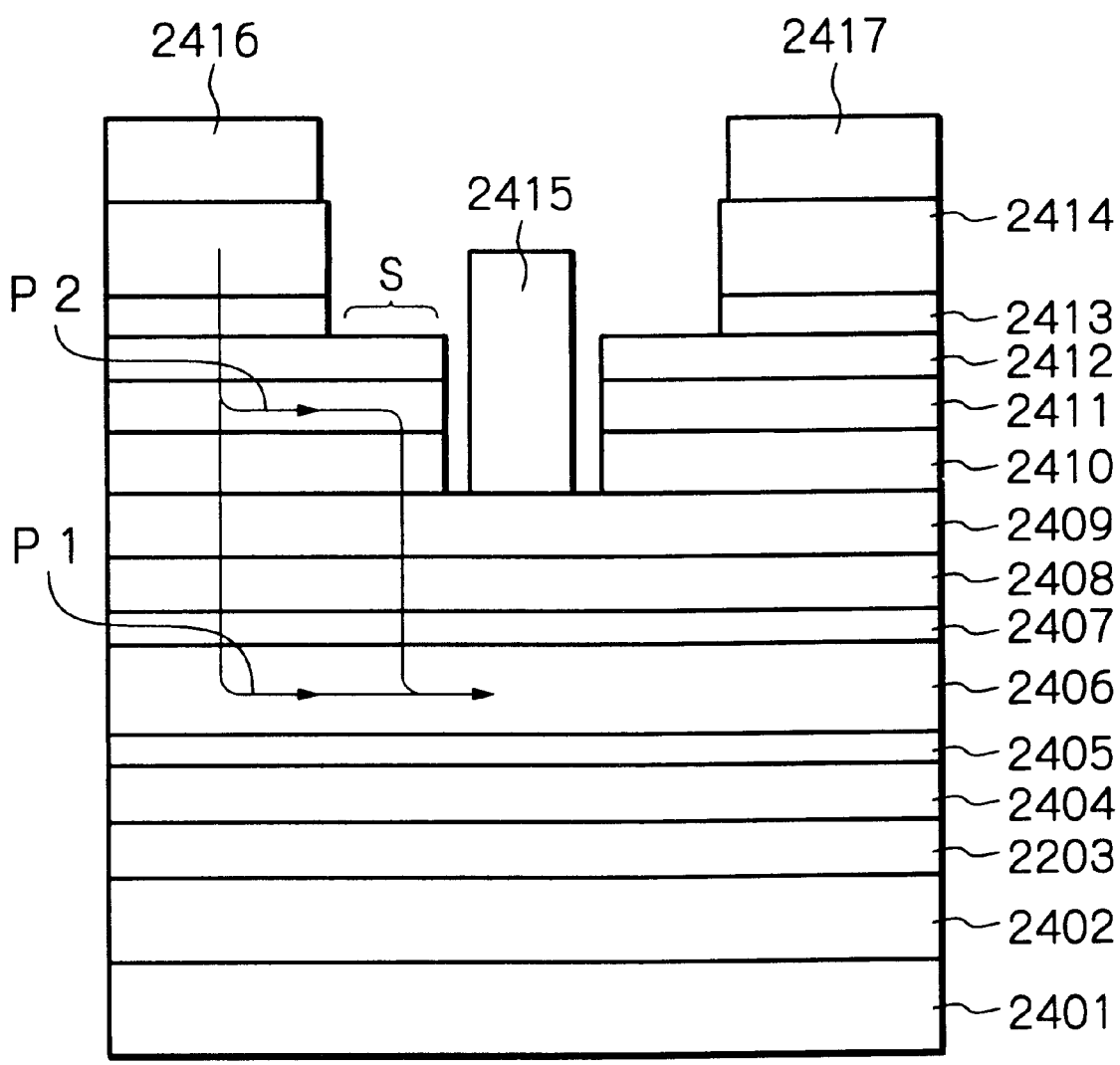

FIG. 32 shows a twenty-fourth embodiment of the FET in accordance with the present invention. This embodiment executes the process of the eleventh embodiment by using the epitaxial wafer of the twenty-second embodiment. As shown, gaps are formed at the sides of the gate electrode 2413.

In the structure shown in FIG. 32 the high concentration n-type impurities doped in the gate contact layer 2409 and wide-recess stopper layer 241 increase the amount of electrodes stored around the interface between the gate buried layer 240 and cap layer 2412 and the gate contact layer 2409. This successfully reduces the contact resistance from the cap layer to the channel layer 2406. Further, the extension of a depletion layer from the surface of the GaAs layer 2412 toward the channel side is stopped in the GaAs layers 2412, 2411 and 2410. This is successful to obstruct the rise of a conduction band at the surface side in the channel and therefore to obviate exhaustion of electrons in the channel. Moreover, a current path is formed not only in the channel (P1, FIG. 32) but also in the gate buried layer (P2, FIG. 32), so that the sheet resistance is reduced in the exposed GaAs gate buried layer portion (S, FIG. 32).

With the structure of FIG. 32, an ON resistance as low as 1.3 Ω·mm was achieved. This ON resistance is lower than the ON resistance of conventional FETs by 0.3 Ω·mm. Also, a gate breakdown voltage of 15 V was achieved because of the gaps formed at the side of the gate electrode 2413.

The illustrative embodiments shown and described each includes an InGaAs channel layer having an In composition of about 0.2 customarily used on a GaAs substrate. Such an InGaAs channel layer may be replaced with a GaAs channel layer, if desired. Also, the present invention is practicable with a single dope, single hetero structure in place of the double dope, double hetero structure positioning the AlGaAs electron supply layer on the top and bottom of the channel layer.

Further, the present invention may even be implemented as a hetero junction FET fabricated on InP, i.e., including an $In_{0.5}Al_{0.5}As$ layer in place of the AlGaAs layer and including an $In_{0.5}Ga_{0.5}As$ layer in place of the $In_{0.2}Ga_{0.8}As$ layer. To produce this kind of FET, use may be made of a tartaric etchant in place of the dry etching scheme mentioned in relation to the illustrative embodiments.

In summary, it will be seen that the present invention provides a hetero junction FET capable of achieving an ON resistance noticeably lower than the conventional ON resistance.

What is claimed is:

1. An FET formed on a semiconductor crystal, comprising:

at least one of an undoped InGaAs channel layer and an undoped GaAs channel layer;

a first AlGaAs gate contact layer formed over said undoped InGaAs channel layer or said undoped GaAs channel layer;

a second GaAs gate buried layer formed on the first AlGaAs contact layer;

A third AlGaAs layer formed on the second GaAs gate buried layer and doped with a high concentration n-type impurity;

a fourth GaAs cap layer formed on the third GaAs layer and including an undoped layer contacting said third AlGaAs layer; and a layer doped with a high concentration n-type impurity and forming a top of said fourth GaAs layer, wherein the second GaAs gate buried layer, third AlGaAs layer and fourth GaAs cap layer have a double recess structure formed by using said first and third AlGaAs layers as etching stopper layers, and wherein said second GaAs gate buried layer and a gate electrode contact each other without any gap.

2. An FET formed on a semiconductor crystal, comprising:

at least one of an undoped InGaAs channel layer and an undoped GaAs channel layer;

a first AlGaAs gate contact layer formed over said undoped InGaAs channel layer or said undoped GaAs channel layer;

a second GaAs gate buried layer formed on the first AlGaAs gate contact layer and including an undoped layer;

A third AlGaAs layer formed on the undoped layer of the second GaAs gate buried layer and doped with a high concentration n-type impurity;

a fourth GaAs cap layer formed on the third GaAs layer and comprising an undoped layer contacting said third AlGaAs layer; and a layer doped with a high concentration n-type impurity and forming a top of said fourth GaAs layer, wherein the second GaAs gate buried layer, third AlGaAs layer and fourth GaAs cap layer have a double recess structure formed by using said first and third AlGaAs layers as etching stopper layers, and wherein a gate electrode is formed on an exposed portion of the first AlGaAs layer and said second GaAs gate buried layer and the gate electrode are spaced by a minimum gap guaranteeing a sufficient gate breakdown voltage.

3. An FET formed on a semiconductor crystal, comprising;

at least one of an undoped InGaAs channel layer and an undoped GaAs channel layer;

a first AlGaAs gate contact layer formed over said undoped InGaAs channel layer or said undoped GaAs channel layer and doped with a high concentration n-type impurity;

a second GaAs gate buried layer formed on the first AlGaAs gate contact layer and including an undoped layer contacting said first AlGaAs layer;

A third AlGaAs layer formed on the second GaAs gate buried layer and doped with a high concentration n-type impurity; and a fourth GaAs cap layer including an undoped layer contacting said third AlGaAs layer; and a layer doped with a high concentration n-type impurity and forming a top of said fourth GaAs layer, wherein the second GaAs gate buried layer, third AlGaAs layer and fourth GaAs cap layer have a double recess structure formed by using said first and third AlGaAs layers as etching stopper layers, and wherein said second GaAs gate buried layer and a gate electrode are spaced by a minimum gap guaranteeing a sufficient gate breakdown voltage.

4. An FET formed on a semiconductor crystal, comprising:

at least one of an undoped InGaAs channel layer and an undoped GaAs channel layer;

a first AlGaAs gate contact layer formed over said undoped InGaAs channel layer or said undoped GaAs channel layer and doped with a high concentration n-type impurity;

a second GaAs gate buried layer formed on the first AlGaAs layer and including an undoped layer contacting said first AlGaAs layer;

a third AlGaas layer formed on the second GaAs gate buried layer; and a fourth GaAs cap layer formed on the third AlGaAs layer;

wherein the second GaAs gate buried layer, the third AlGaAs layer and the fourth GaAs cap layer have a double recess structure formed by using said first and third AlGaAs layers as etching stopper layers, and wherein said second GaAs gate buried layer and a gate electrode are spaced by a minimum gap guaranteeing a sufficient gate breakdown voltage.

5. An FET formed on a semiconductor crystal, comprising;

a least one of an undoped InGaAs channel layer and an undoped GaAs channel layer;

a first AlGaAs gate contact layer formed over said undoped InGaAs channel layer or said undoped GaAs channel layer and doped with a high concentration n-type impurity;

a second GaAs gate buried layer comprising a first undoped layer contacting the first AlGaAs layer and a second undoped layer;

a third AlGaAs layer contacting the second undoped layer of the second GaAs gate buried layer and doped with a high concentration n-type impurity;

a fourth GaAs cap layer including an undoped layer contacting said third AlGaAs layer; and a layer doped with a high concentration n-type impurity and forming a top of said fourth GaAs layer, wherein the second GaAs gate buried layer, the third AlGaAs layer and the fourth GaAs cap layer have a double recess structure formed by using said first and third AlGaAs layers as etching stopper layers, and wherein a gate electrode is formed on an exposed portion of the first AlGaAs layer, and said second GaAs gate buried layer and the gate electrode are spaced by a minimum gap guaranteeing a sufficient gate breakdown voltage.

6. An FET formed on a semiconductor crystal, comprising:

at least one of an undoped InGaAs channel layer and an undoped GaAs channel layer;

a first AlGaAs gate contact layer formed over said undoped InGaAs channel layer or said undoped GaAs channel layer;

a second GaAs gate buried layer having a three layer structure sequentially comprising one of a layer doped with an n-type impurity and an undoped layer contacting the first AlGaAs layer, a layer doped with a high concentration n-type impurity, and a layer doped with an n-type impurity;

a third AlGaAs layer formed on the second GaAs gate buried layer and doped with a high concentration n-type impurity;

a fourth GaAs cap layer including an undoped layer contacting said third AlGaAs layer; and a layer doped with a high concentration n-type impurity and forming a top of said fourth GaAs layer, wherein the second GaAs gate buried layer, the third AlGaAs layer and the fourth GaAs cap layer have a double recess structure formed by using said first and third AlGaAs layers as etching stopper layers, and wherein the second GaAs gate buried layer and a gate electrode are spaced by a minimum distance guaranteeing a sufficient gate breakdown voltage.

7. An FET formed on a semiconductor crystal, comprising:

at least one of an undoped InGaAs channel layer and an undoped GaAs channel layer;

a first AlGaAs gate contact layer formed over said undoped InGaAs channel layer or said undoped GaAs channel layer;

a second GaAs gate buried layer having a three-layer structure sequentially comprising one of a layer doped with an n-type impurity and an undoped layer contacting the first AlGaAs gate contact layer, a layer doped with a high concentration of n-type impurity, and an undoped layer;

a third AlGaAs layer formed on the second GaAs gate buried layer and doped with a high concentration n-type impurity;

a fourth GaAs cap layer including an undoped layer contacting said third AlGaAs layer; and a layer doped with a high concentration n-type impurity and forming a top of said fourth GaAs layer, wherein the second GaAs gate buried layer, the third AlGaAs layer and the fourth GaAs cap layer have a double recess structure formed by using said first and third AlGaAs layers as etching stopper layers, and wherein a gate electrode is formed on an exposed portion of the first AlGaAs layer and said second GaAs gate buried layer and the gate electrode are spaced by a minimum distance guaranteeing a sufficient gate breakdown voltage.

8. An FET formed on a semiconductor crystal, comprising:

at least one of an undoped InGaAs channel layer and an undoped GaAs channel layer;

a first AlGaAs gate contact layer formed over said undoped InGaAs channel layer or said undoped GaAs channel layer and doped with a high concentration n-type impurity;

a second GaAs gate buried layer having a three-layer structure sequentially comprising an undoped layer contacting the first AlGaAs gate contact layer, a layer doped with a high concentration n-type impurity and a layer doped with an n-type impurity;

a third AlGaAs layer formed on the second GaAs buried layer and doped with a high concentration n-type impurity;

a fourth GaAs cap layer including an undoped layer contacting said third AlGaAs layer; and a layer doped with a high concentration n-type impurity and forming a top of said fourth GaAs layer, wherein the second Gaas gate buried layer, the third AlGaAs layer and the fourth GaAs cap layer have a double recess structure formed by using said first and third AlGaAs layers as etching stopper layers, and wherein the second GaAs gate buried layer and a gate electrode are spaced by a minimum distance guaranteeing a sufficient gate breakdown voltage.

9. An FET formed on a semiconductor crystal, comprising:

at least one of an undoped InGaAs channel layer and an undoped GaAs channel layer;

a first AlGaAs gate contact layer formed over said undoped InGaAs channel layer or said undoped GaAs channel layer and doped with a high concentration n-type impurity;

a second GaAs gate buried layer having a three-layer structure sequentially comprising an undoped layer contacting the first AlGaAs gate contact layer, a layer doped with a high concentration n-type impurity and an undoped layer;

a third AlGaAs layer doped with a high concentration n-type impurity;

a fourth GaAs cap layer including an undoped layer contacting said third AlGaAs layer; and a layer doped with a high concentration n-type impurity and forming a top of said GaAs layer, wherein the second GaAs gate buried layer, the third AlGaas layer and the fourth GaAs cap layer have a double recess structure formed by using said first and third AlGaAs layers as etching stopping layers, and wherein a gate electrode is formed on an exposed portion of the first AlGaAs layer and said second GaAs gate buried layer and the gate electrode are spaced by a minimum gap guaranteeing a sufficient gate breakdown voltage.

10. An FET on a semiconductor crystal, comprising:

at least one of an undoped InGaAs channel layer and an undoped GaAs channel layer;

a first AlGaAs gate contact layer formed over said undoped InGaAs channel layer or said undoped GaAs channel layer and doped with a high concentration n-type impurity;

a second Gaas gate buried layer formed on the first AlGaAs gate contact layer;

a third AlGaAs layer formed on the second Gaas gate buried layer and doped with a high concentration n-type impurity; and a fourth GaAs cap layer formed on the third AlGaAs layer, wherein the second GaAs gate buried layer, the third AlGaAs layer and the fourth GaAs cap layer have a double recess structure formed by using said first and third AlGaAs layers as etching stopper layers, and wherein the GaAs gate buried layer and a gate electrode are spaced by a minimum distance guaranteeing a sufficient gate breakdown voltage.

11. An FET formed on a semiconductor crystal, comprising:

at least one of an undoped InGaAs channel layer and an undoped GaAs channel layer;

a first AlGaAs gate contact layer formed over said undoped InGaAs channel layer or said undoped GaAs channel layer and doped with a high concentration n-type impurity;

a second GaAs gate buried layer having a three layer structure sequentially comprising a layer doped with an n-type impurity contacting the first AlGaAs gate contact layer, a layer doped with a high concentration n-type impurity, and a layer doped with an n-type impurity;

a third AlGaAs layer formed on the second GaAs gate buried layer and doped with a high concentration n-type impurity; and a fourth GaAs cap layer formed on the third AlGaAs layer, wherein the second GaAs gate buried layer, the third AlGaAs layer and the fourth GaAs cap layer have a double recess structure formed by using said first and third AlGaAs layers as etching stopper layers, and wherein said second GaAs gate buried layer and a gate electrode are spaced by a minimum gap guaranteeing a sufficient gate breakdown voltage.

* * * * *